US012046634B2

(12) United States Patent
Chang et al.

(10) Patent No.: US 12,046,634 B2
(45) Date of Patent: *Jul. 23, 2024

(54) DUAL SIDE CONTACT STRUCTURES IN SEMICONDUCTOR DEVICES

(71) Applicant: Taiwan Semiconductor Manufacturing Co., Ltd., Hsinchu (TW)

(72) Inventors: Cheng-Wei Chang, Taipei (TW); Shuen-Shin Liang, Hsinchu County (TW); Sung-Li Wang, Zhubei (TW); Hsu-Kai Chang, Hsinchu (TW); Chia-Hung Chu, Taipei (TW); Chien-Shun Liao, New Taipei (TW); Yi-Ying Liu, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 18/158,148

(22) Filed: Jan. 23, 2023

(65) Prior Publication Data

US 2023/0163169 A1 May 25, 2023

Related U.S. Application Data

(63) Continuation of application No. 17/162,587, filed on Jan. 29, 2021, now Pat. No. 11,563,083.

(60) Provisional application No. 63/065,897, filed on Aug. 14, 2020.

(51) Int. Cl.
*H01L 29/06* (2006.01)
*H01L 29/10* (2006.01)
(Continued)

(52) U.S. Cl.
CPC ...... *H01L 29/0665* (2013.01); *H01L 29/1033* (2013.01); *H01L 29/41733* (2013.01); *H01L 29/42392* (2013.01); *H01L 29/66742* (2013.01)

(58) Field of Classification Search
CPC ............. H01L 29/0665; H01L 29/1033; H01L 29/41733; H01L 29/42392;
(Continued)

(56) References Cited

U.S. PATENT DOCUMENTS

| 9,105,490 B2 | 8/2015 | Wang et al. |
| 9,236,267 B2 | 1/2016 | De et al. |

(Continued)

FOREIGN PATENT DOCUMENTS

TW 202009996 A 3/2020

*Primary Examiner* — Changhyun Yi
(74) *Attorney, Agent, or Firm* — Sterne, Kessler, Goldstein & Fox P.L.L.C.

(57) ABSTRACT

A semiconductor device with dual side source/drain (S/D) contact structures and methods of fabricating the same are disclosed. The semiconductor device includes first and second S/D regions, a nanostructured channel region disposed between the first and second S/D regions, a gate structure surrounding the nanostructured channel region, first and second contact structures disposed on first surfaces of the first and second S/D regions, a third contact structure disposed on a second surface of the first S/D region, and an etch stop layer disposed on a second surface of the second S/D region. The third contact structure includes a metal silicide layer, a silicide nitride layer disposed on the metal silicide layer, and a conductive layer disposed on the silicide nitride layer.

20 Claims, 39 Drawing Sheets

(51) Int. Cl.
*H01L 29/417* (2006.01)
*H01L 29/423* (2006.01)
*H01L 29/66* (2006.01)

(58) Field of Classification Search
CPC .......... H01L 29/66742; H01L 29/0673; H01L 21/28518; H01L 29/78696; H01L 29/41766; H01L 21/76897; H01L 21/76843; H01L 27/0924
See application file for complete search history.

(56) References Cited

U.S. PATENT DOCUMENTS

| | | |
|---|---|---|
| 9,236,300 B2 | 1/2016 | Liaw |
| 9,406,804 B2 | 8/2016 | Huang et al. |
| 9,443,769 B2 | 9/2016 | Wang et al. |
| 9,520,482 B1 | 12/2016 | Chang et al. |
| 9,548,366 B1 | 1/2017 | Ho et al. |
| 9,576,814 B2 | 2/2017 | Wu et al. |
| 9,831,183 B2 | 11/2017 | Lin et al. |
| 9,837,414 B1 | 12/2017 | Balakrishnan et al. |
| 9,859,386 B2 | 1/2018 | Ho et al. |
| 11,563,083 B2 * | 1/2023 | Chang ................ H01L 29/0665 |
| 2018/0240871 A1 | 8/2018 | Cheng et al. |
| 2019/0221649 A1 | 7/2019 | Glass et al. |
| 2020/0066894 A1 | 2/2020 | Frougier et al. |
| 2020/0161574 A1 | 5/2020 | Vasen et al. |
| 2022/0139911 A1 | 5/2022 | Wei et al. |

* cited by examiner

DUAL SIDE CONTACT STRUCTURES IN SEMICONDUCTOR DEVICES

CROSS-REFERENCE TO RELATED APPLICATIONS

This application is a continuation of U.S. patent application Ser. No. 17/162,587, titled "Dual Side Contact Structures in Semiconductor Devices," filed Jan. 29, 2021, which claims the benefit of U.S. Provisional Patent Application No. 63/065,897, titled "Ti silicide formation under backside via structure," filed Aug. 14, 2020, each of which is incorporated by reference in its entirety.

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs and fin field effect transistors (finFETs). Such scaling down has increased the complexity of semiconductor manufacturing processes.

BRIEF DESCRIPTION OF THE DRAWINGS

Aspects of this disclosure are best understood from the following detailed description when read with the accompanying figures.

Figure 1A:
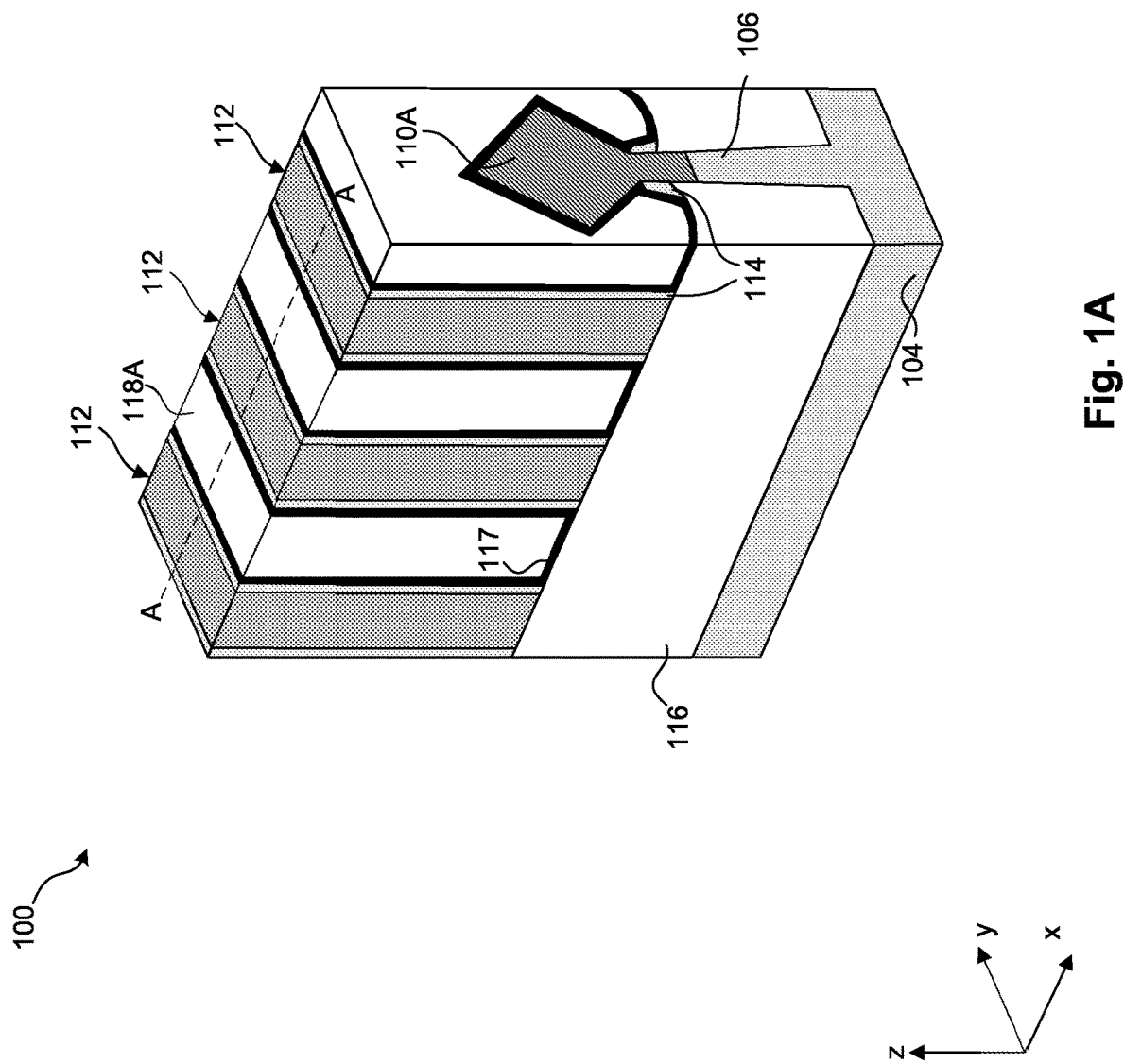
FIG. 1A illustrates an isometric view of a semiconductor device, in accordance with some embodiments.

Illustrative embodiments will now be described with reference to the accompanying drawings. In the drawings, like reference numerals generally indicate identical, functionally similar, and/or structurally similar elements. The discussion of elements with the same annotations applies to each other, unless mentioned otherwise.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the process for forming a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the embodiments and/or configurations discussed herein.

Spatially relative terms, such as "beneath," "below," "lower," "above," "upper," and the like may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein.

The fin structures disclosed herein may be patterned by any suitable method. For example, the fin structures may be patterned using one or more photolithography processes, including double-patterning or multi-patterning processes. Double-patterning or multi-patterning processes can combine photolithography and self-aligned processes, allowing patterns to be created that have, for example, pitches smaller than what is otherwise obtainable using a single, direct photolithography process. For example, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures.

The present disclosure provides example semiconductor devices (e.g., finFETs, gate-all-around (GAA) FETs, and/or MOSFETs) with dual side source/drain (S/D) contact structures and provides example methods of forming such semiconductor devices with reduced contact resistance between S/D regions and S/D contact structures. The example method forms arrays of epitaxial S/D regions and gate structures on fin structures of FETs. In some embodiments, one or more S/D regions can have S/D contact structures that are formed on opposite sides of the FETs. One of the S/D contact structures ("front S/D contact structures") can be formed on a first surface ("front-side surface") of the FETs. The other S/D contact structures ("back S/D contact structures") can be formed on a second side ("back-side surface") of the FETs. The back S/D contact structures can electrically connect the FETs to a back-side power rail of an integrated circuit (IC).

In some embodiments, the back S/D contact structures can include liner-free back vias that are formed by a bottom-up deposition process. The back vias can include Ru-based conductive materials to reduce contact resistance between the back S/D contact structures and S/D regions compared to FETs with non-Ru-based back vias. In some embodiments, the Ru-based back vias with diameters or widths less than about 20 nm (e.g., about 15 nm, about 12.5 nm, about 10 nm, about 7.5 nm, about 5 nm, or about 2 nm) can have lower resistivity compared to copper (Cu), tungsten (W), or Co-based back vias with similar dimensions. Thus, with the use of the Ru-based back vias, compact and low-resistive back S/D contact structures can be formed on the back-side of the FETs.

Each of the back S/D contact structures can further include a stack of metal silicide layer and metal silicide nitride layer disposed between the back vias and the S/D regions. In some embodiments, the metal silicide (MS) layer and metal silicide nitride (MSN) layer of NFETs and PFETs can have the same metal (M) (e.g., titanium (Ti)) or can have metals different from each other. In some embodiments, the MS layers of NFETs can include n-type work function metal silicide (nWFMS) layers (e.g., titanium silicide) that have a work function value closer to a conduction band energy than a valence band energy of the n-type S/D regions. In contrast, the silicide layers of the PFETs can include p-type WFMS (pWFMS) layers (e.g., nickel silicide) that have a work function value closer to a valence band energy than a conduction band energy of the p-type S/D regions.

FIG. 1A illustrates an isometric view of a FET 100, according to some embodiments. FET 100 can have six different cross-sectional views, as illustrated in FIGS. 1B-1F, according to some embodiments. FIGS. 1B-1F illustrate cross-sectional views of FET 100 along line A-A with additional structures that are not shown in FIG. 1A for simplicity. The discussion of elements in FIGS. 1A-1F with the same annotations applies to each other, unless mentioned otherwise. In some embodiments, FET 100 can represent n-type FET 100 (NFET 100) or p-type FET 100 (PFET 100) and the discussion of FET 100 applies to both NFET 100 and PFET 100, unless mentioned otherwise.

Referring to FIG. 1A, FET 100 can include an array of gate structures 112 disposed on a fin structure 106 and an array of S/D regions 110A-110C (S/D region 110A visible in FIG. 1A; 110B-110C visible in FIG. 1B) disposed on portions of fin structure 106 that are not covered by gate structures 112. FET 100 can further include gate spacers 114, shallow trench isolation (STI) regions 116, etch stop layers (ESLs) 117A-117C (ESLs 117B-117C not shown in FIG. 1A for simplicity; shown in FIG. 1B), and interlayer dielectric (ILD) layers 118A-118C (ILD layers 118B-118C not shown in FIG. 1A for simplicity; shown in FIG. 1B). ILD layer 118A can be disposed on ESL 117A. In some embodiments, gate spacers 114, STI regions 116, ESLs 117A-117C, and ILD layers 118A-118C can include an insulating material, such as silicon oxide, silicon nitride (SiN), silicon carbon nitride (SiCN), silicon oxycarbon nitride (SiOCN), and silicon germanium oxide. In some embodiments, gate spacers 114 can have a thickness of about 2 nm to about 9 nm for adequate electrical isolation of gate structures 112 from adjacent structures.

FET 100 can be formed on a substrate 104. There may be other FETs and/or structures (e.g., isolation structures) formed on substrate 104. Substrate 104 can be a semiconductor material, such as silicon, germanium (Ge), silicon germanium (SiGe), a silicon-on-insulator (SOI) structure, and a combination thereof. Further, substrate 104 can be doped with p-type dopants (e.g., boron, indium, aluminum, or gallium) or n-type dopants (e.g., phosphorus or arsenic). In some embodiments, fin structure 106 can include a material similar to substrate 104 and extend along an X-axis.

Figure 1B:
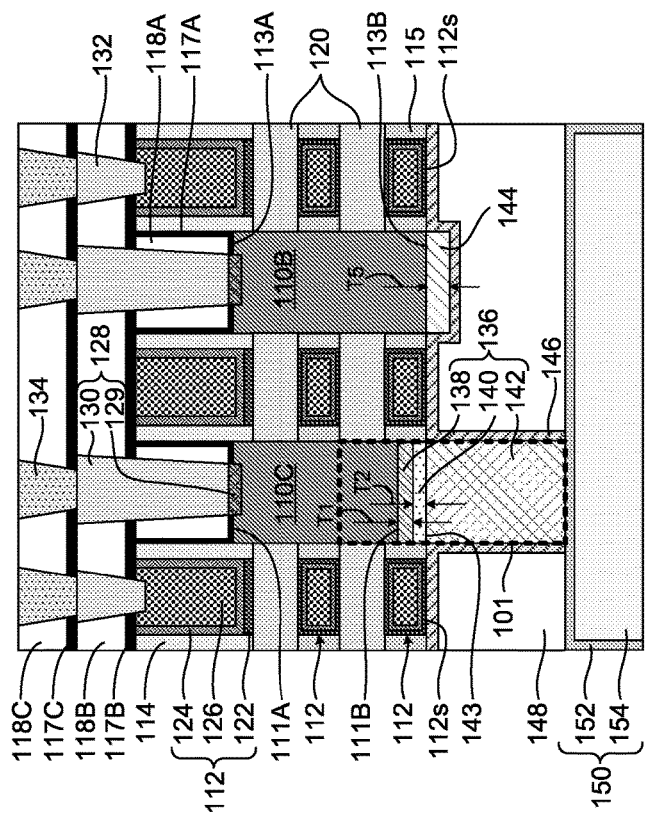
FIGS. 1B-1F illustrate cross-sectional views of a semiconductor device with dual side contact structures, in accordance with some embodiments.

Referring to FIG. 1B, FET 100 can include (i) stacks of nanostructured channel regions 120, (ii) gate structures 112, (iii) S/D region 110B-110C, (iv) front S/D contact structures 128, (v) gate contact structures 132, (vi) front vias 134, (vii) a back S/D contact structure 136, (viii) a back ESL 144, (ix) a back barrier layer 146, (x) a back ILD layer 148, and (xi) a back metal line 150.

Nanostructured channel regions 120 can include semiconductor materials similar to or different from substrate 104. In some embodiments, nanostructured channel regions 120 can include (i) an elementary semiconductor, such as Si and Ge; (ii) a compound semiconductor including a III-V semiconductor material; (iii) an alloy semiconductor including SiGe, germanium stannum, or silicon germanium stannum; or (iv) a combination thereof. Though rectangular cross-sections of nanostructured channel regions 120 are shown, nanostructured channel regions 120 can have cross-sections of other geometric shapes (e.g., circular, elliptical, triangular, or polygonal).

Gate structures 112 can be multi-layered structures and can surround each of nanostructured channel regions 120 for which gate structures 112 can be referred to as "gate-all-around (GAA) structures" or "horizontal gate-all-around (HGAA) structures." FET 100 can be referred to as "GAA FET 100." The portions of gate structures 112 surrounding nanostructured channel regions 120 can be electrically isolated from adjacent S/D regions 110B-110C by inner spacers 115. Inner spacers 115 can include a material similar to gate spacers 114. In some embodiments, FET 100 can be a finFET and have fin regions (not shown) instead of nanostructured channel regions 120. Gate contact structures 132 can be disposed on gate structures 112 and can include a conductive material, such as cobalt (Co), tungsten (W), ruthenium (Ru), iridium (Ir), nickel (Ni), osmium (Os), rhodium (Rh), aluminum (Al), molybdenum (Mo), copper (Cu), zirconium (Zr), stannum (Sn), silver (Ag), gold (Au), zinc (Zn), cadmium (Cd), and a combination thereof.

Each of gate structures 112 can include an interfacial oxide (IO) layer 122, a high-k (HK) gate dielectric layer 124 disposed on IO layer 122, and a conductive layer 126 disposed on HK gate dielectric layer 124. IO layers 122 can include silicon oxide ($SiO_2$), silicon germanium oxide ($SiGeO_x$), or germanium oxide ($GeO_x$). HK gate dielectric layers 124 can include a high-k dielectric material, such as hafnium oxide ($HfO_2$), titanium oxide ($TiO_2$), hafnium zirconium oxide (HfZrO), tantalum oxide ($Ta_2O_3$), hafnium silicate ($HfSiO_4$), zirconium oxide ($ZrO_2$), and zirconium silicate ($ZrSiO_2$). Conductive layers 126 can be multi-layered structures. The different layers of conductive layers 126 are not shown for simplicity. Each of conductive layers 126 can include a WFM layer disposed on HK dielectric layer 124, and a gate metal fill layer on the WFM layer. For n-type FET 100 (NFET 100), the WFM layers can include titanium aluminum (TiAl), titanium aluminum carbide (TiAlC), tantalum aluminum (TaAl), tantalum aluminum carbide (TaAlC), Al-doped Ti, Al-doped TiN, Al-doped Ta, Al-doped TaN, other suitable Al-based materials, or a combination thereof. For p-type FET 100 (PFET 100), the WFM layers can include substantially Al-free (e.g., with no Al) Ti-based or Ta-based nitrides or alloys, such as titanium nitride (TiN), titanium silicon nitride (TiSiN), titanium gold (Ti—Au) alloy, titanium copper (Ti—Cu) alloy, tantalum nitride (TaN), tantalum silicon nitride (TaSiN), tantalum gold (Ta—Au) alloy, tantalum copper (Ta—Cu), and a combination thereof. The gate metal fill layers can include a suitable conductive material, such as tungsten (W), Ti, silver (Ag), ruthenium (Ru), molybdenum (Mo), copper (Cu), cobalt (Co), Al, iridium (Ir), nickel (Ni), metal alloys, and a combination thereof.

For NFET 100, each of S/D regions 110A-110C can include an epitaxially-grown semiconductor material, such as Si, and n-type dopants, such as phosphorus and other suitable n-type dopants. For PFET 100, each of S/D regions 110A-110C can include an epitaxially-grown semiconductor material, such as Si or SiGe, and p-type dopants, such as boron and other suitable p-type dopants. In some embodiments, S/D regions 110A-110C can include SiGe with Ge concentration ranging from about 21 atomic percent to about 40 atomic percent. In some embodiments, S/D regions 110A-110C can have single crystalline SiGe structure. In some embodiments, the semiconductor material of S/D regions 110A-110C can epitaxially grow in a [004] crystal direction along a Z-axis. As a result, first surfaces 111A and 113A (also referred to as "front-side surfaces 111A and 113A") and second surfaces 111B and 113B (also referred to as "back-side surfaces 111B and 113B") of S/D regions 110B and 110C can have (004) crystal orientations (also referred to as "(004) crystal planes"), according to some embodiments.

Front S/D contact structures 128 can be disposed on first surfaces 111A and 113A. In some embodiments, each of front S/D contact structures 128 can include a silicide layer 129 and a contact plug 130 disposed on silicide layer 129. In some embodiments, contact plug 130 can include a conductive material similar to gate contact structures 132.

In some embodiments, for NFET 100, silicide layers 129 can include a metal or a metal silicide with a work function value closer to a conduction band-edge energy than a valence band-edge energy of the material of S/D regions 110B-110C. For example, the metal or the metal silicide can have a work function value less than 4.5 eV (e.g., about 3.5 eV to about 4.4 eV), which can be closer to the conduction band energy (e.g., 4.1 eV for Si) than the valence band energy (e.g., 5.2 eV for Si) of Si-based material of S/D regions 110B-110C. In some embodiments, for NFET 100, the metal silicide of silicide layers 129 can include titanium silicide ($Ti_xSi_y$), tantalum silicide ($Ta_xSi_y$), molybdenum ($Mo_xSi_y$), zirconium silicide ($Zr_xSi_y$), hafnium silicide ($Hf_xSi_y$), scandium silicide ($Sc_xSi_y$), yttrium silicide ($Y_xSi_y$), terbium silicide ($Tb_xSi_y$), lutetium silicide ($Lu_xSi_y$), erbium silicide ($Er_xSi_y$), ybtterbium silicide ($Yb_xSi_y$), europium silicide ($Eu_xSi_y$), thorium silicide ($Th_xSi_y$), or a combination thereof.

In some embodiments, for PFET 100, silicide layers 129 can include a metal or a metal silicide with a work function value closer to a valence band-edge energy than a conduction band-edge energy of the material of S/D regions 110B-110C. For example, the metal or the metal silicide can have a work function value greater than 4.5 eV (e.g., about 4.5 eV to about 5.5 eV), which can be closer to the valence band energy (e.g., 5.2 eV for Si) than the conduction band energy (e.g., 4.1 eV for Si) of Si-based material of S/D regions 110B-110C. In some embodiments, for PFET 100, the metal silicide of silicide layers 129 can include nickel silicide ($Ni_xSi_y$), cobalt silicide ($Co_xSi_y$), manganese silicide ($Mn_xSi_y$), tungsten silicide ($W_xSi_y$), iron silicide ($Fe_xSi_y$), rhodium silicide ($Rh_xSi_y$), palladium silicide ($Pd_xSi_y$), ruthenium silicide ($Ru_xSi_y$), platinum silicide ($Pt_xSi_y$), iridium silicide ($Ir_xSi_y$), osmium silicide ($Os_xSi_y$), or a combination thereof.

Front vias 134 can be disposed on front S/D contact structures 128 and gate contact structures 132 and can include conductive materials, such as Ru, Co, Ni, Al, Mo, W, Ir, Os, Cu, and Pt. Front S/D contact structures 128 can electrically connect to overlying interconnect structures (not shown), power supplies (not shown), and/or other elements of FET 100 and/or IC through front vias and provide electrical conduction to S/D regions 110B-110C through front-side surfaces 111A and 113A.

Back S/D contact structure 136 can be disposed on second surface 111B. In some embodiments, back S/D contact structure 136 can include a silicide layer 138 disposed on second surface 111B, a silicide nitride layer 140 disposed on silicide layer 138, and a back via 142 disposed on silicide nitride layer 140. The discussion of silicide layers 129 applies to silicide layer 138, unless mentioned otherwise. In some embodiments, silicide layers 129 and 138 can have the same material or different material from each other. Silicide nitride layer 140 can be configured to prevent the diffusion of metal atoms from back via 142 to silicide layer 138 and/or S/D region 110C. Silicide nitride layer 140 can include a metal similar to or different from the metal of silicide layer 138. In some embodiments, silicide layer 138 can include titanium silicide ($TiSi_x$) and silicide nitride layer 140 can include titanium silicide nitride (TiSiN).

Thickness T1 of silicide layer 138 along a Z-axis can be greater than thickness T2 of silicide nitride layer 140 along a Z-axis. In some embodiments, thickness T1 can range from about 1 nm to about 6 nm and thickness T2 can range from about 0.5 nm to about 4 nm. If thickness T1 is below about 1 nm, silicide layer 138 may not adequately reduce contact resistance to provide a highly conductive interface between S/D region 110C and back via. If thickness T2 is below about 0.5 nm, silicide nitride layer 140 may not adequately prevent the diffusion of metal atoms from back via 142 to silicide layer 138 and/or S/D region 110C. On the other hand, if the thicknesses T1 and T2 are greater than about 6 nm and about 4 nm, respectively, the processing time (e.g., silicidation reaction time and/or nitridation time) for the formation of silicide layer 138 and silicide nitride layer 140 increases, and consequently increases device manufacturing cost.

Back via 142 can include low-resistivity metals, such as ruthenium (Ru), iridium (Ir), nickel (Ni), Osmium (Os), rhodium (Rh), aluminum (Al), molybdenum (Mo), platinum (Pt), and cobalt (Co). In some embodiments, Ru-based back via 142 with dimensions (e.g., diameter or widths along X- and/or Y-axis) less than about 20 nm (e.g., about 15 nm, about 12.5 nm, about 10 nm, about 7.5 nm, about 5 nm, or about 2 nm) can have lower resistivity compared to Cu, W, or Co-based back via with similar dimensions. Back via 142 can be formed without a liner along the sidewalls of back via 142. Compared to vias with liners, liner-free back via 142 can have a larger cross-sectional area, which can lead to reduced resistivity because resistivity of a material is inversely proportional to the cross-sectional area of the material. Also, the larger cross-sectional area can result in larger contact area with S/D region 110C through silicide layer 138 and silicide nitride layer 140, thus resulting in reduced contact resistance between S/D region 110C and back via 142.

In some embodiments, interface 143 between silicide nitride layer 140 and back via 142 can be substantially coplanar with gate surfaces 112s of gate structures 112 and/or second surface 113B of S/D region 110B, or can be at a surface plane lower than gate surfaces 112s and/or second surface 113B. Such relative position of interface 143 with respect to gate surfaces 112s and/or second surface 113B can prevent any portions of back via 142 from being positioned adjacent to any portions of gate structures 112 to minimize parasitic capacitance between back via 142 and gate structures 112.

Figure 1C:
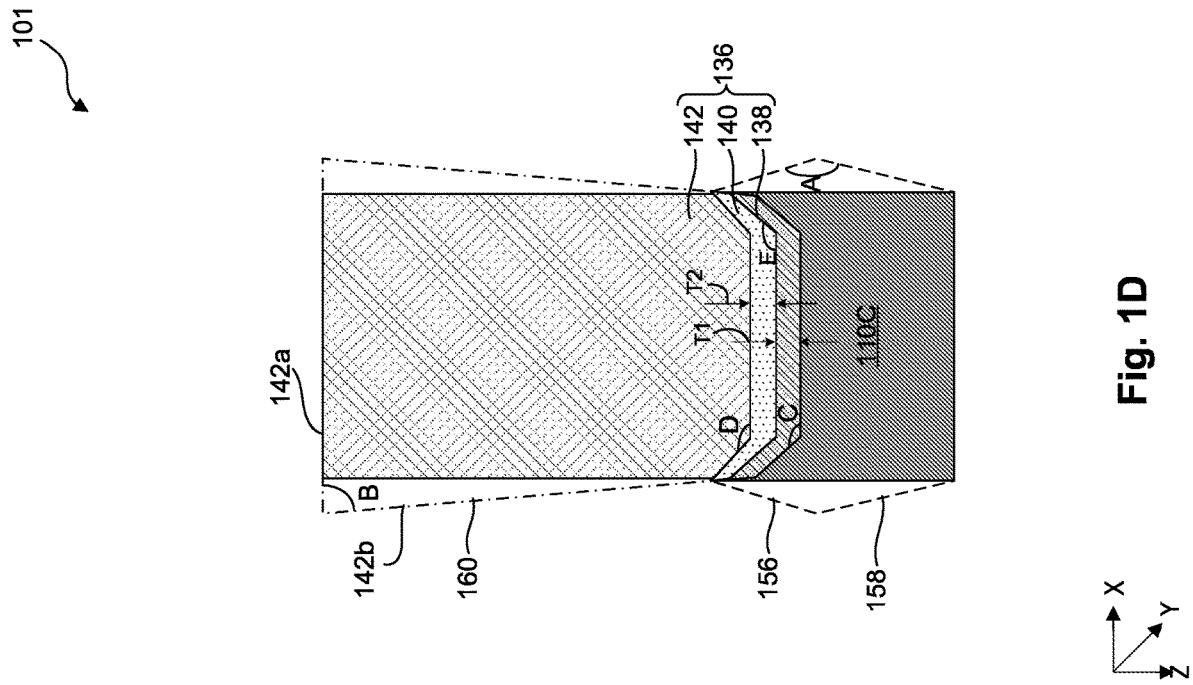
Figure 1D:
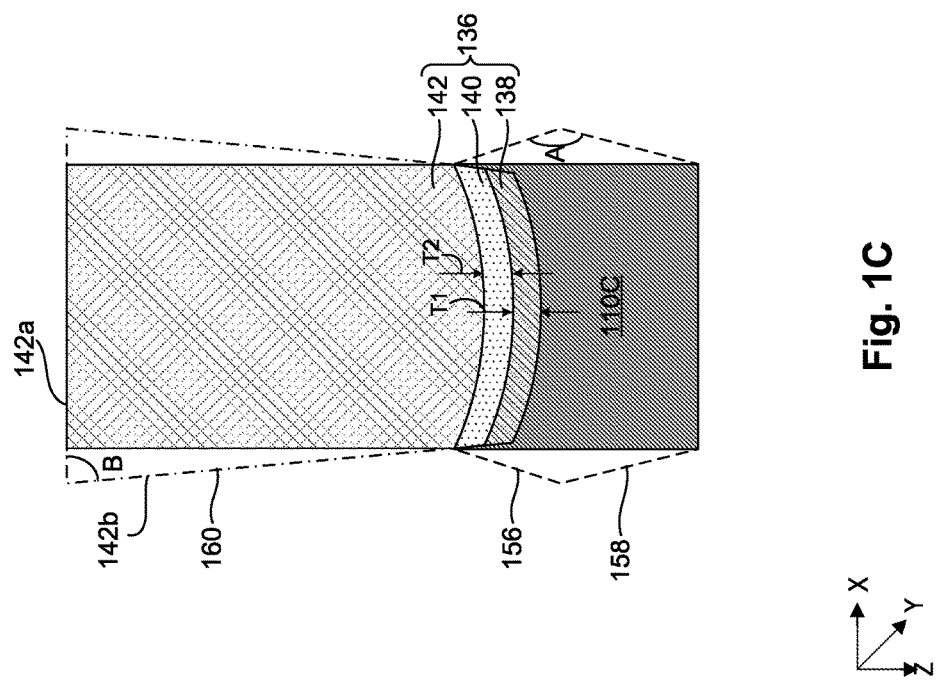
Figure 1E:
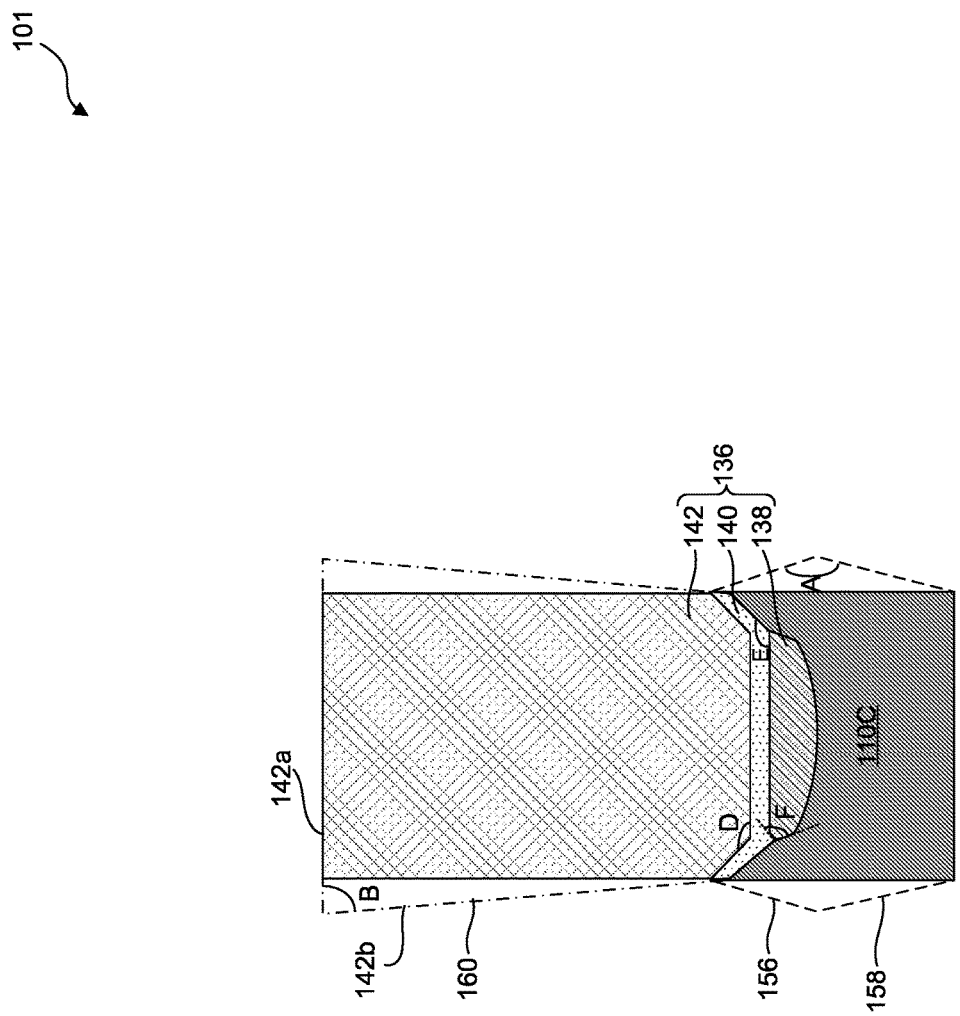

In some embodiments, back S/D contact structure 136 and S/D region 110C can have cross-sectional views as shown in FIGS. 1C-1E, instead of that shown in FIG. 1B. FIGS. 1C-1E show enlarged views of region 101 of FIG. 1B. S/D region 110 can have non-linear sidewall profiles, as shown with dashed lines in FIGS. 1C-1E, and can have faceted sidewall surfaces 156 and 158. Sidewall surface 156 can have (111) crystal orientation (also referred to as "(111) crystal plane") and sidewall surface 158 can have (110) crystal orientation (also referred to as "(110) crystal plane"). Sidewall surfaces 158 and 156 intersect with each other to form an angle A, which can range from about 125 degrees to about 135 degrees. In some embodiments, S/D region 110C can have a width along X-axis ranging from about 30 nm to about 50 nm.

In some embodiments, back via 142 can have sidewalls 142b with sloped profiles, as shown with dash-dotted lines in FIGS. 1C-1E. Sidewalls 142b can form an angle B ranging from about 75 degrees to about 90 degrees with surface 142a. Angle B is formed within this range to provide an optimal contact area between back via 142 and back metal line 150 (shown in FIG. 1B) without compromising device size and manufacturing cost. In some embodiments, the width or diameter of surface 142a along an X-axis can range from about 10 nm to about 25 nm.

In some embodiments, top and bottom surfaces of silicide layer 138 and silicide nitride layer 140 can be formed with curved profiles (shown in FIG. 1C), instead of substantially flat profiles (shown in FIG. 1B), to provide a larger contact area for reduced contact resistance between back via 142 and S/D region 110C. For larger contact area, top and bottom surfaces of silicide layer 138 and silicide nitride layer 140 can have faceted profiles, as shown in FIG. 1D, instead of curved profiles. Though each of the top and bottom surfaces are shown to have three facets, the top and bottom surfaces can be formed with any number of facets to provide a larger contact area between back via 142 and S/D region 110C. In some embodiments, adjacent facets can form angles C-E (shown in FIG. 1D) ranging from about 120 degrees to about 140 degrees. Though silicide layer 138 and silicide nitride layer 140 are shown to have similar profiles in FIGS. 1B-1D, silicide layer 138 and silicide nitride layer 140 can have different profiles from each other, as shown in FIG. 1E. In some embodiments, adjacent facets can form angle F (shown in FIG. 1E) ranging from about 120 degrees to about 140 degrees. The curvature of the interface between silicide layer 138 and S/D region 110C, including bottom surface of silicide layer 138 and top surface of S/D region 110C, is about 5.34 to 5.64.

Referring back to FIG. 1B, back ESL 144 can be disposed on second surface 113B of S/D region 110B. Back ESL 144 can protect S/D region 110B during the formation of back S/D contact structure 136, which is described in detail below. Back ESL 144 can include an epitaxially-grown semiconductor material (e.g., boron-doped SiGe (SiGeB)) that is different from the epitaxially-grown semiconductor material of S/D region 110B.

Figure 1F:
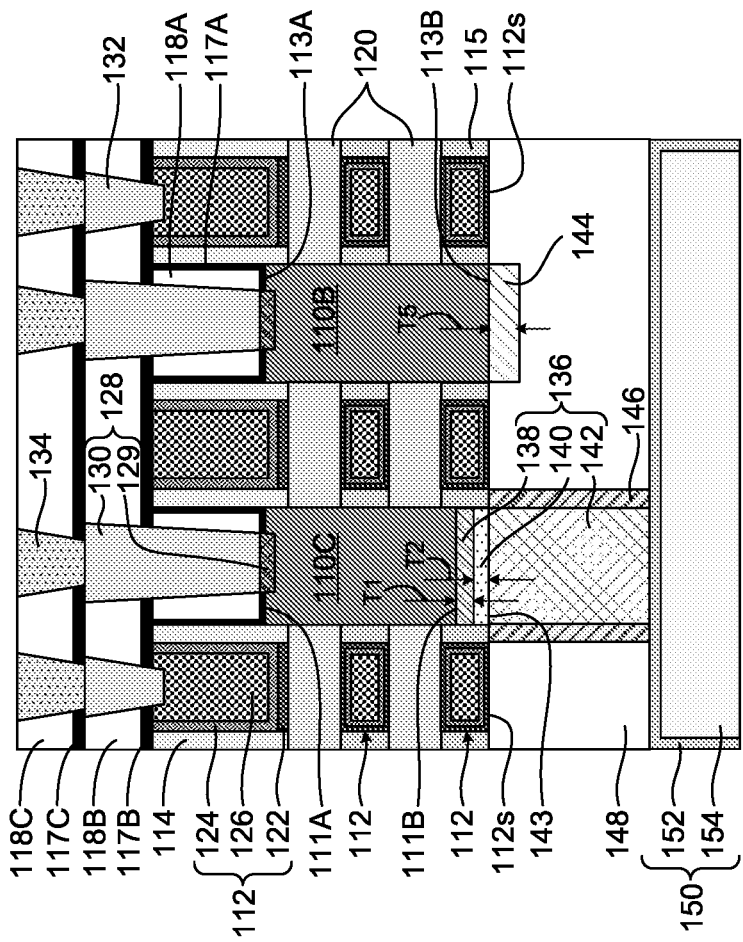

Back barrier layer 146 can include a nitride material (e.g., SiN) and can be disposed as continuous layer between back ILD layer 148 and back S/D contact structure 136, gate structures 112, and back ESL 144. In some embodiments, instead of the continuous layer of FIG. 1B, back barrier layer 146 can be limited to the sidewalls of S/D contact structure 136, as shown in FIG. 1F. Back barrier layer 146 can reduce or prevent the diffusion of oxygen atoms from back ILD layer 148 to back S/D contact structure 136 to prevent the oxidation of the conductive material of back via 142. Back ILD layer 148 can include an insulating material, such as silicon oxide, silicon oxycarbon nitride (SiOCN), silicon oxynitride (SiON), and silicon germanium oxide. Back metal line 150 can electrically connect back S/D contact structure 136 to a back power rail and can include a metal liner 152 and a conductive plug 154.

Figure 2:
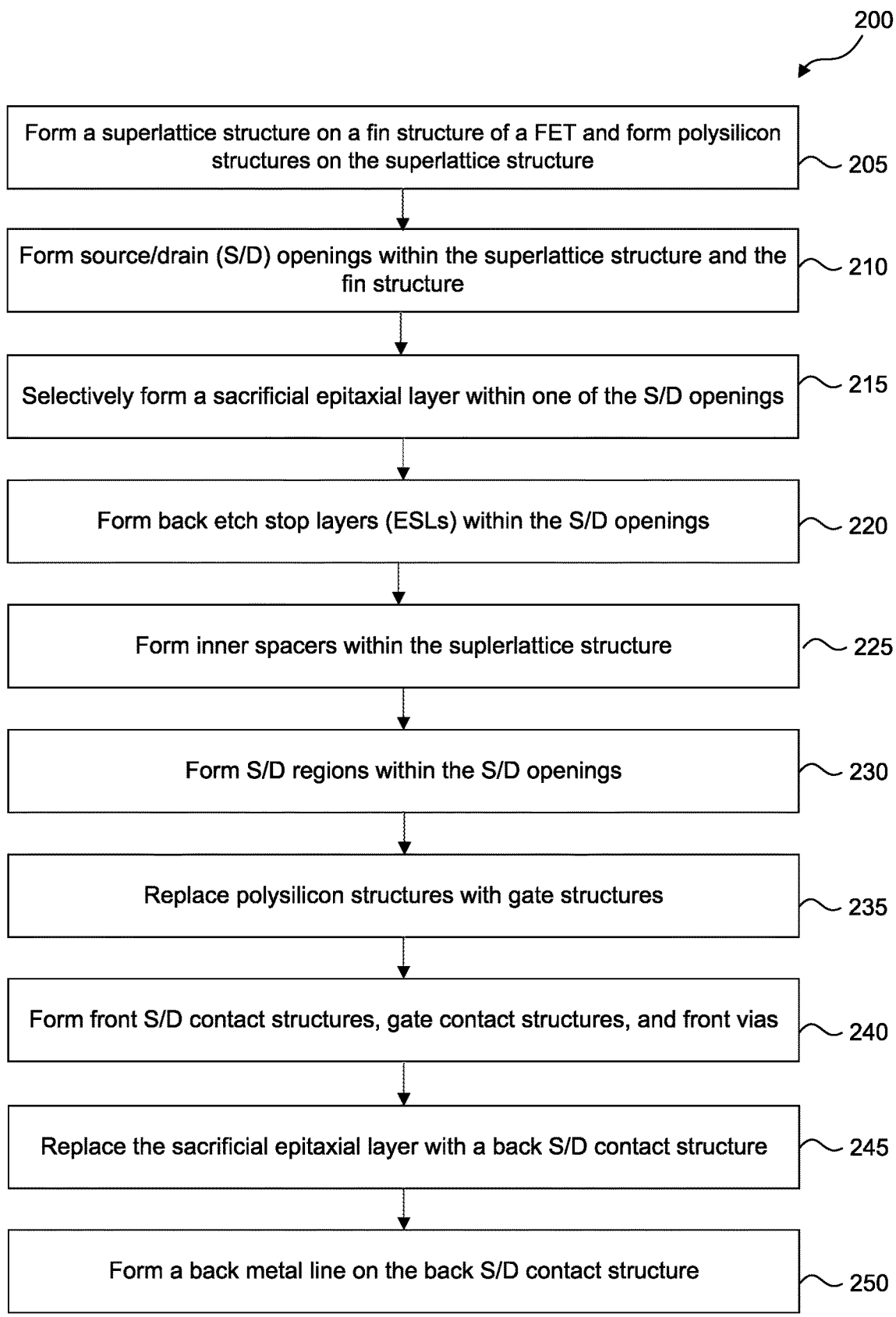
FIG. 2 is a flow diagram of a method for fabricating a semiconductor device with dual side contact structures, in accordance with some embodiments.

FIG. 2 is a flow diagram of an example method 200 for fabricating FET 100 with the cross-sectional view of FIG. 1B, according to some embodiments. For illustrative purposes, the operations illustrated in FIG. 2 will be described with reference to the example fabrication process for fabricating FET 100 as illustrated in FIGS. 3-24. FIGS. 3-24 are cross-sectional views of FET 100 along line A-A of FIG. 1A at various stages of fabrication, according to some embodiments. Operations can be performed in a different order or not performed depending on specific applications. It should be noted that method 200 may not produce a complete FET 100. Accordingly, it is understood that additional processes can be provided before, during, and after method 200, and that some other processes may only be briefly described herein. Elements in FIGS. 3-24 with the same annotations as elements in FIGS. 1A-1E are described above.

Figure 3:
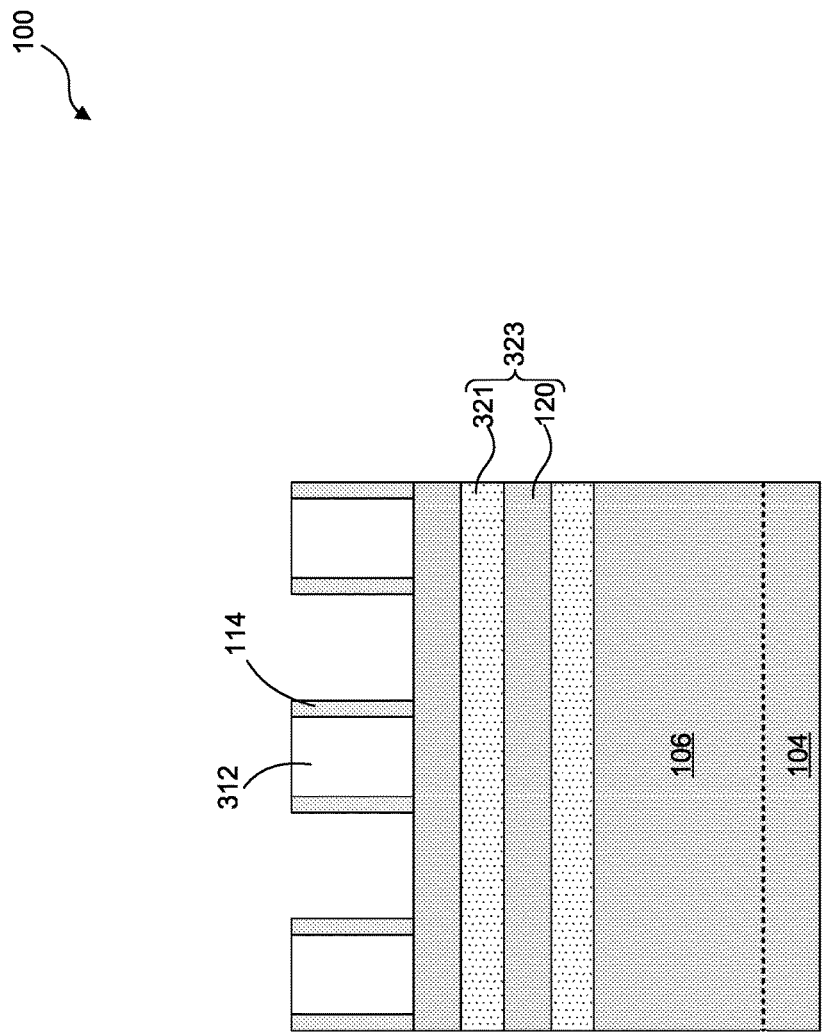
FIGS. 3-24 illustrate cross-sectional views of a semiconductor device with dual side contact structures at various stages of its fabrication process, in accordance with some embodiments.

In operation 205, a superlattice structure is formed on a fin structure of a FET, and polysilicon structures are formed on the superlattice structure. For example, as shown in FIG. 3, polysilicon structures 312 are formed on a superlattice structure 323, which is formed on fin structure 106. Superlattice structure 323 can include nanostructured layers 120 and 321 arranged in an alternating configuration. In some embodiments, nanostructured layers 321 can include SiGe and nanostructured layers 120 can include Si without any substantial amount of Ge (e.g., with no Ge). During subsequent processing, polysilicon structures 312 and nanostructured layers 321 can be replaced in a gate replacement process to form gate structures 112.

Figure 4:
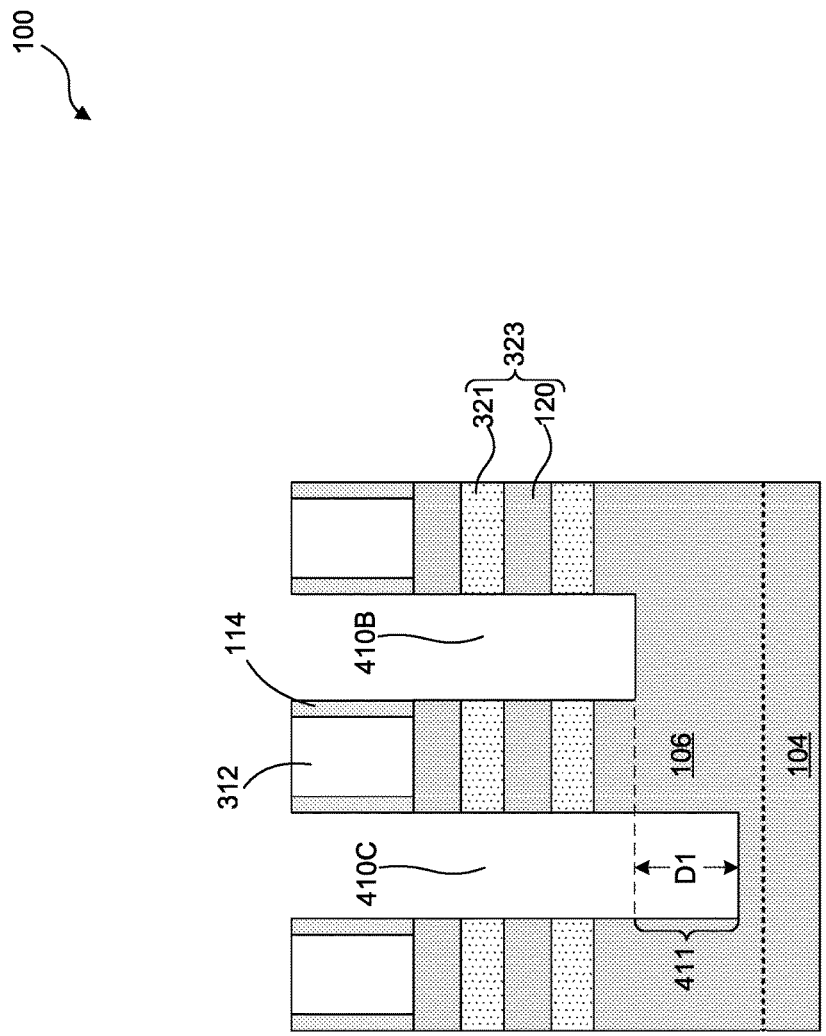

Referring to FIG. 2, in operation 210, S/D openings are formed within the superlattice structure and the fin structure. For examples, as shown in FIG. 4, S/D openings 410B-410C are formed within superlattice structure 323 and fin structure 106. During subsequent processing, S/D regions 110B-110C can be formed within respective S/D openings 410B-410C. S/D opening 410C extends deeper into fin structure 106 than S/D opening 410B by a distance D1. During subsequent processing, back S/D contact structure 136 can be formed within the extended portion 411 of S/D opening 410C.

Figure 5:
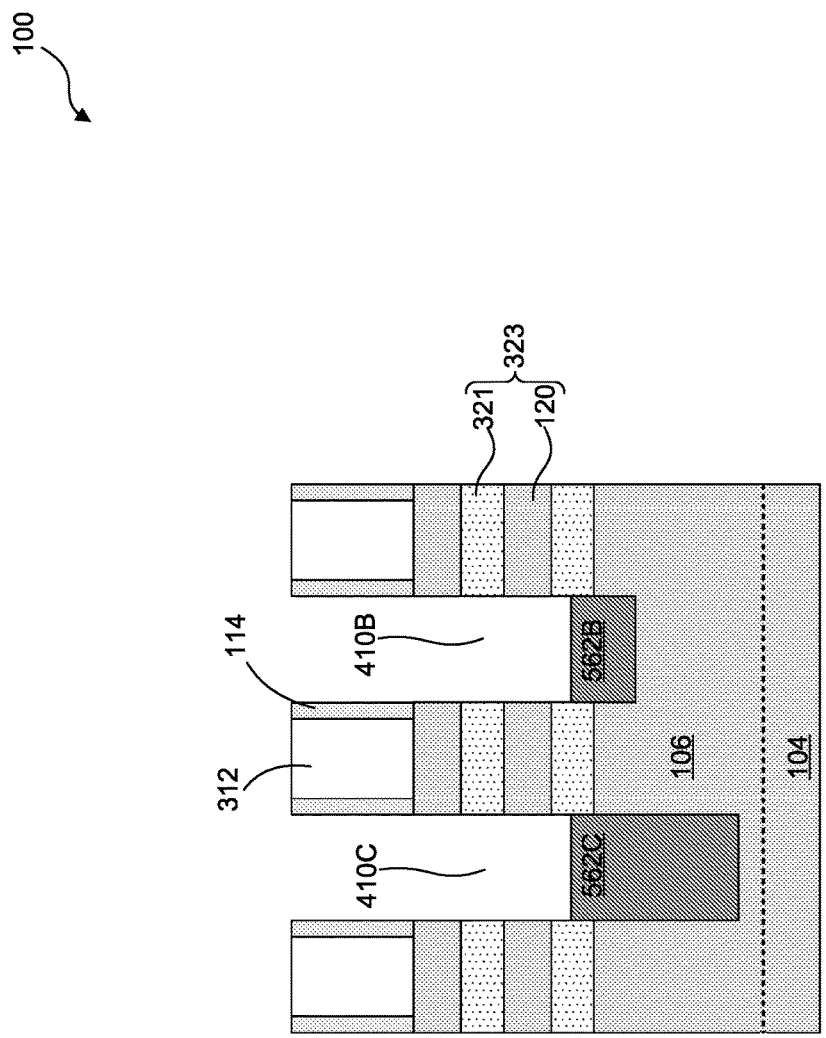
Figure 6:
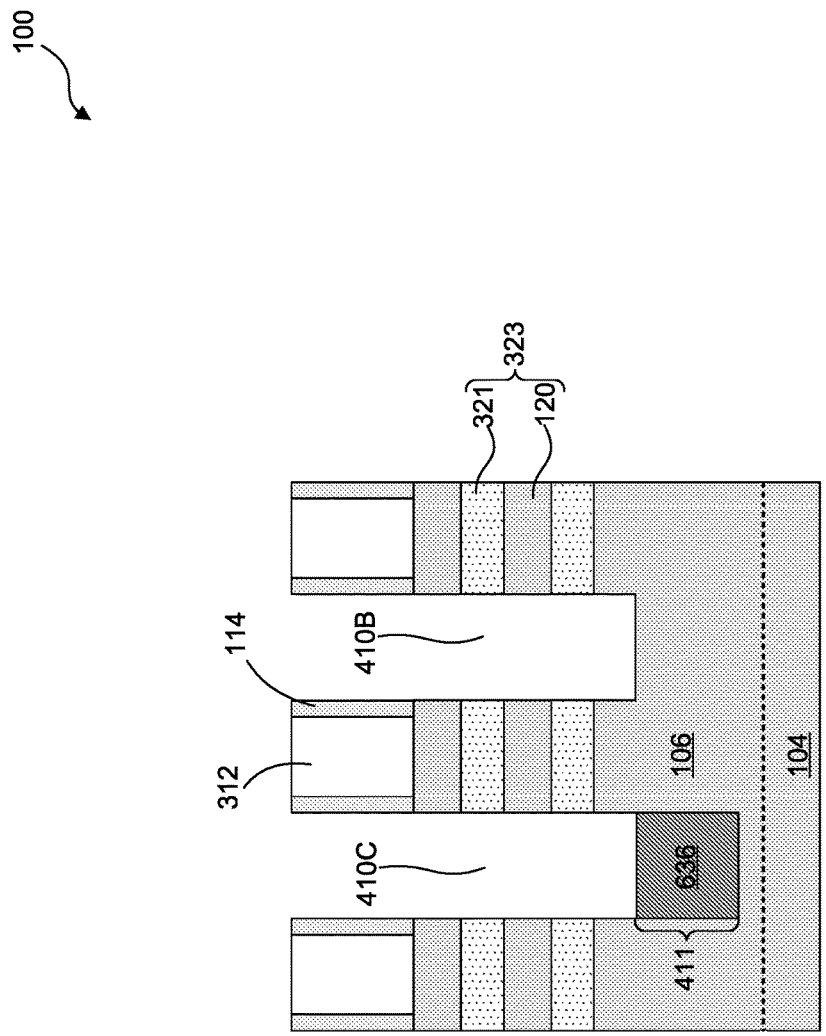

Referring to FIG. 2, in operation 215, a sacrificial epitaxial layer is selectively formed within one of the S/D openings. For example, as described with reference to FIGS. 5-6, a sacrificial epitaxial layer 636 is formed within S/D opening 410C. During subsequent processing, sacrificial epitaxial layer 636 can be replaced with back S/D contact structure 136, as described below. The formation of sacrificial epitaxial layer 636 can include sequential operations of (i) forming epitaxial layers 562B-562C within respective S/D openings 410B-410C, as shown in FIG. 5, and (ii) etching epitaxial layers 562B-562C at the same time to remove epitaxial layer 562B and to form sacrificial epitaxial layer 636 within extended portion 411, as shown in FIG. 6. Epitaxial layers 562B-562C can be formed by epitaxially growing a semiconductor material similar to or different from the material of S/D regions 110B-110C. In some embodiments, epitaxial layers 562B-562C can include SiGe and can be formed using silane ($SiH_4$), germane ($GeH_4$), and dichlorosilane (DCS). The etching of epitaxial layers 562B-562C can include using a gas mixture of nitrogen trifluoride ($NF_3$) and argon (Ar).

Figure 7:
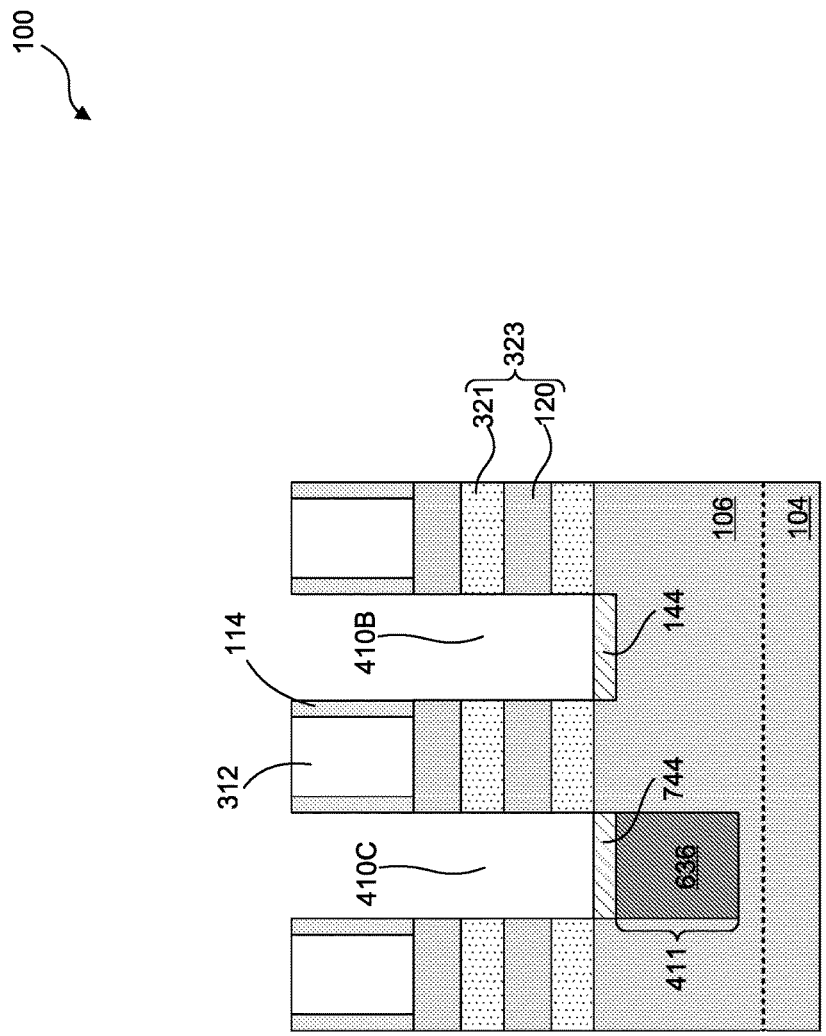

Referring to FIG. 2, in operation 220, back ESLs are formed within the S/D openings. For example, as shown in FIG. 7, back ESLs 144 and 744 are formed within respective S/D openings 410B and 410C. In some embodiments, back ESLs 144 and 744 can be formed at the same time by epitaxially growing boron-doped SiGe on the exposed portion of fin structure 106 within S/D opening 410B and on sacrificial epitaxial layer 636, respectively.

Figure 8:
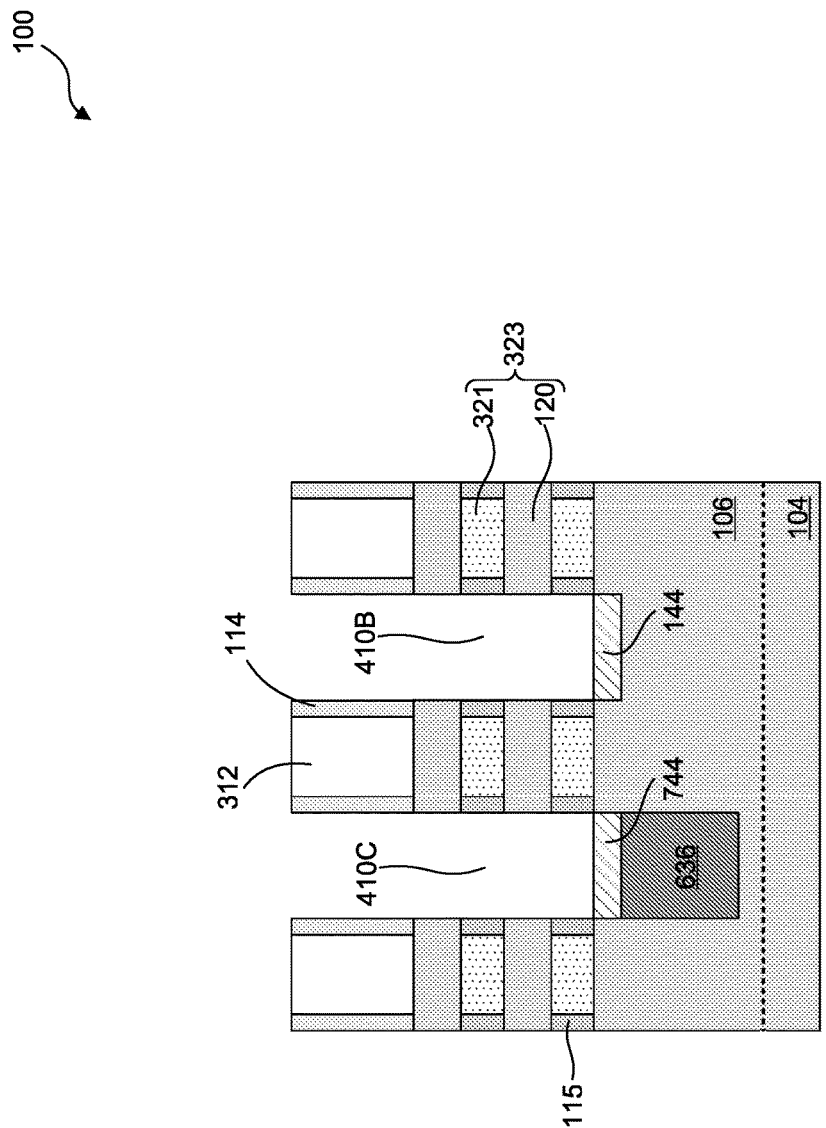
Figure 9:
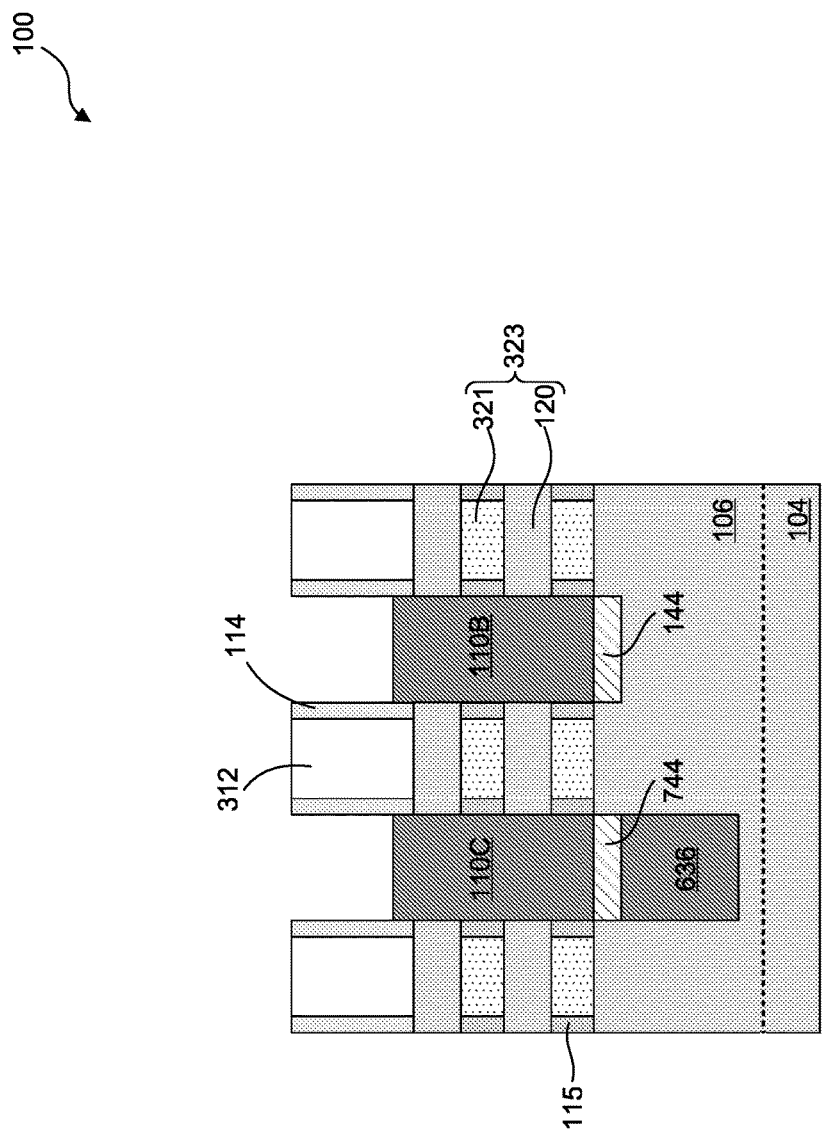
Figure 10:
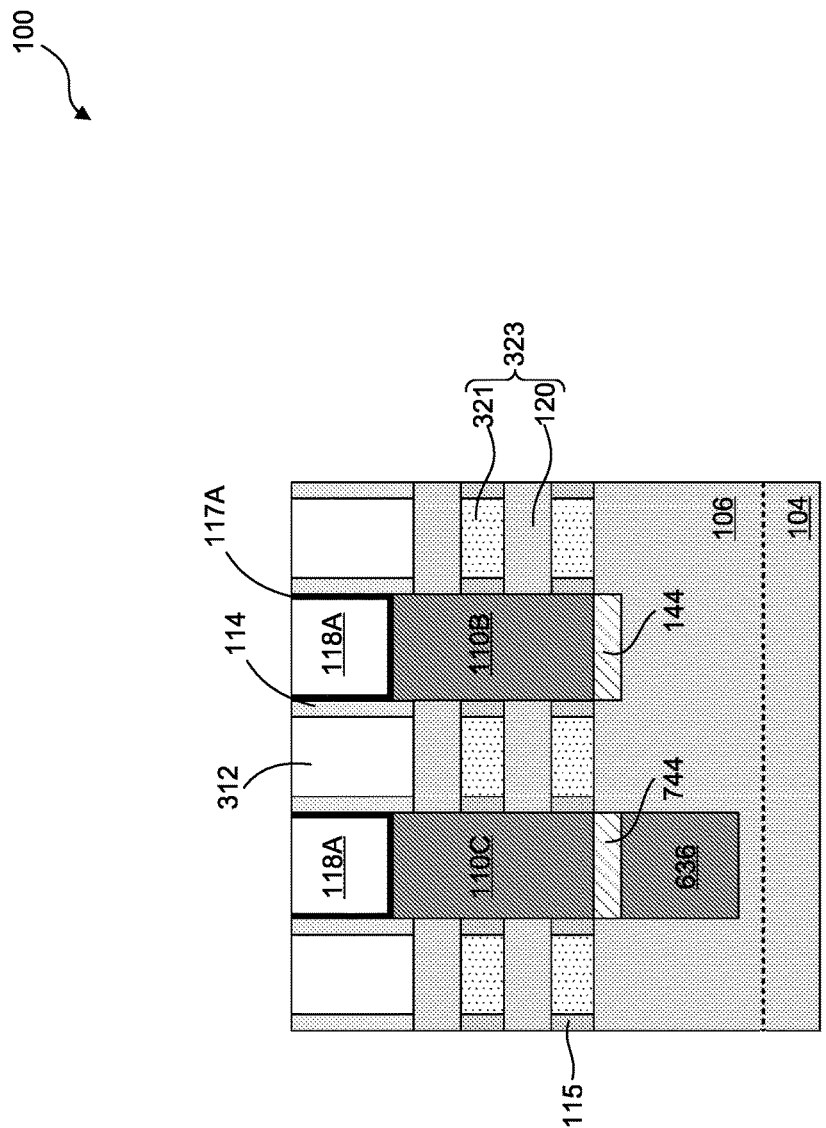

Referring to FIG. 2, in operation 225, inner spacers are formed within the superlattice structure. For example, as shown in FIG. 9, inner spacers 115 are formed within nanostructured layers 321 of superlattice structure 323. The formation of inner spacers 115 can include sequential operations of (i) etching nanostructured layers 321 along an X-axis, (ii) depositing an insulating material on the etched nanostructured layers 321, and (iii), etching the deposited insulating material to form inners spacers 115, as shown in FIG. 8.

Referring to FIG. 2, in operation 230, S/D regions are formed within the S/D openings. For example, as shown in FIG. 9, S/D regions 110B-110C are formed within respective S/D openings 410B-410C. The formation of S/D regions 110B and 110C can include epitaxially growing a semiconductor material at the same time on respective back ESLs 144 and 744. In some embodiments, the semiconductor material can include SiGe. After the formation of S/D regions 110B-110C, ESL 117A and ILD layer 118A can be formed to form the structure of FIG. 10.

Figure 11:
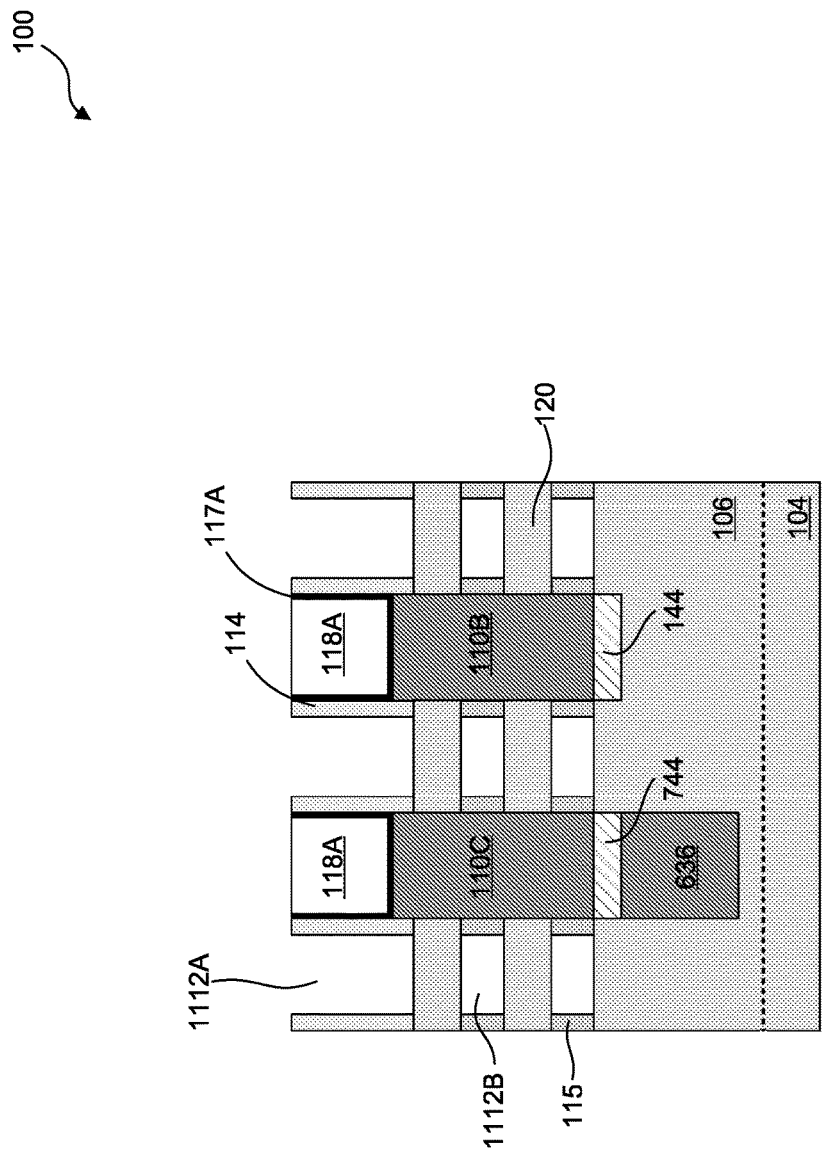
Figure 12:
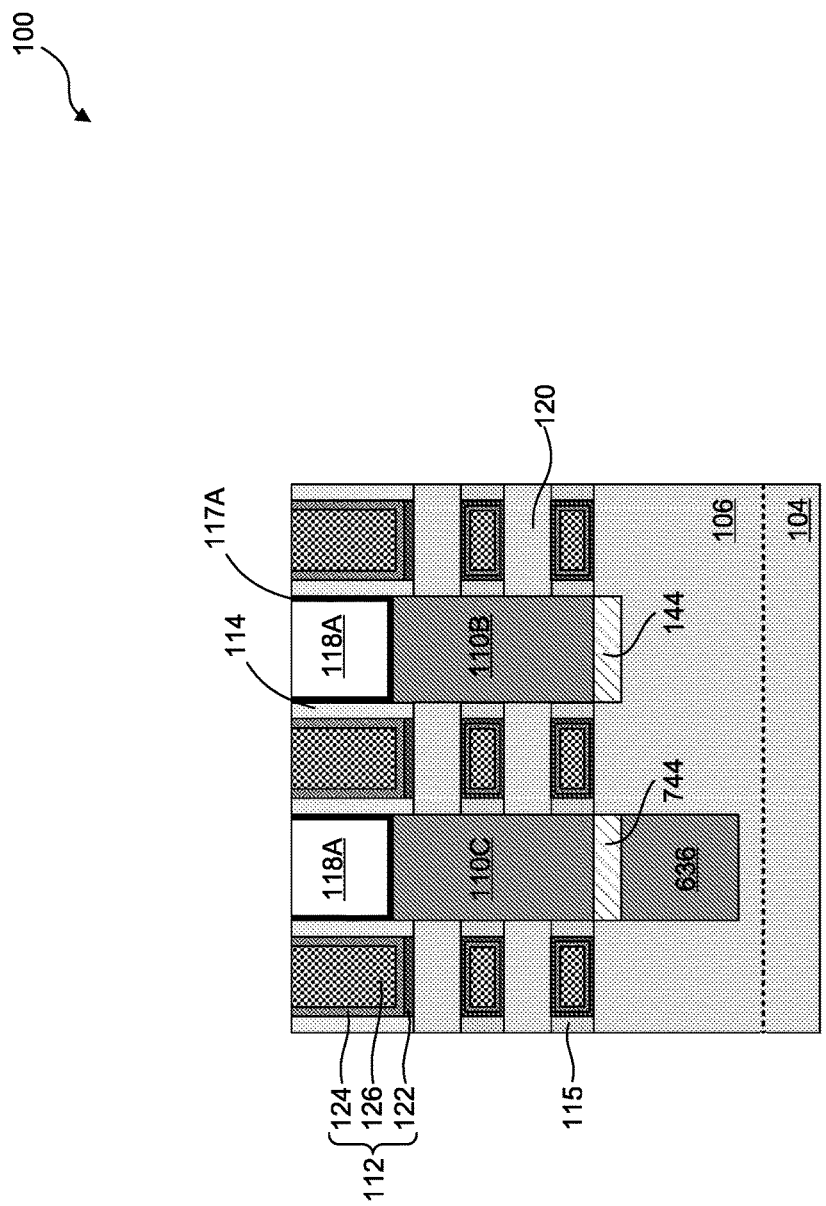

Referring to FIG. 2, in operation 235, the polysilicon structures are replaced with gate structures. For example, as described with reference to FIGS. 11-12, polysilicon structures 312 are replaced with gate structures 112. The replacement of polysilicon structures 312 with gate structures 112 can include sequential operations of (i) etching polysilicon structures 312 to form gate openings 1112A, as shown in FIG. 11, (ii) etching nanostructured layers 321 through gate openings 1112A to form gate openings 1112B, as shown in FIG. 11, (iii) forming JO layers 122 within gate openings 1112A-1112B, as shown in FIG. 12, (iv) depositing a high-k gate dielectric material on the structure of FIG. 11 after the formation of IO layers 122, (v) depositing a conductive material on the high-k gate dielectric material, and (vi) performing a chemical mechanical process (CMP) on the high-k gate dielectric material and the conductive material to form high-k gate dielectric layers 124 and conductive layers 126, respectively, as shown in FIG. 12.

Figure 13:
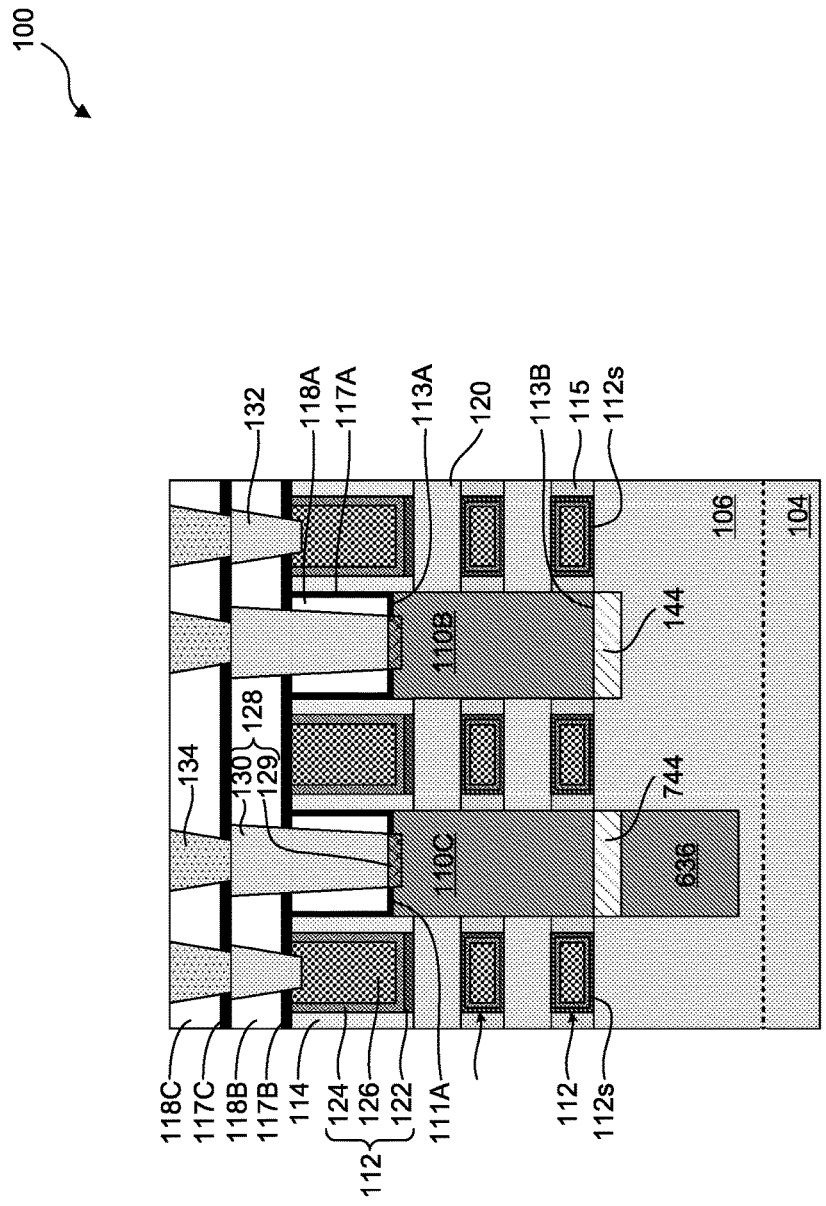
Figure 14:
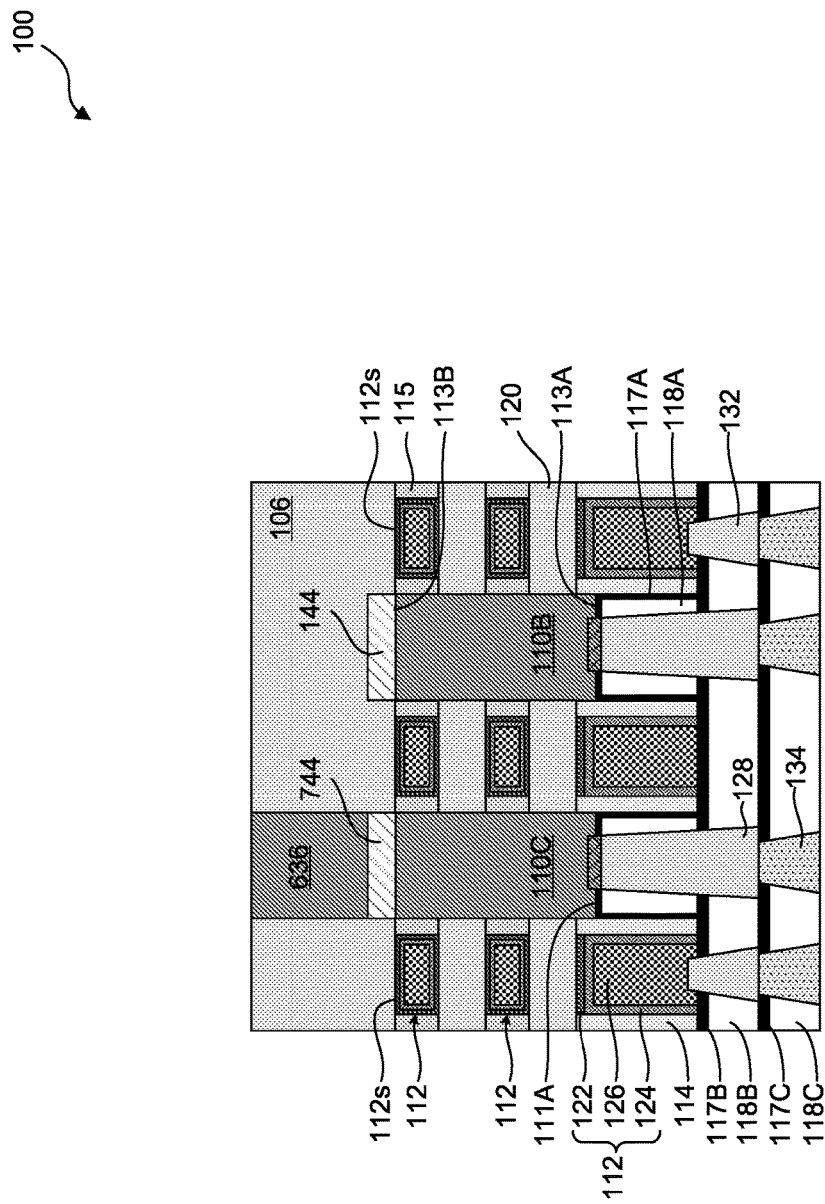
Figure 15:
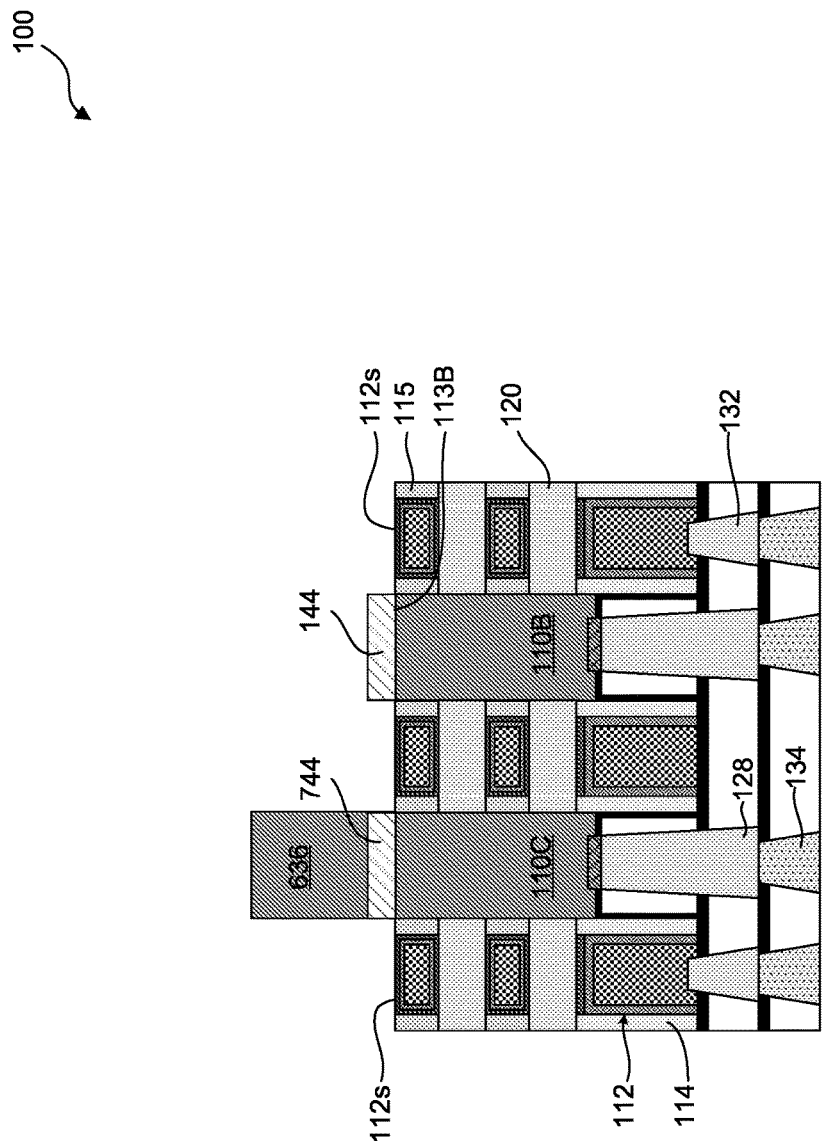
Figure 16:
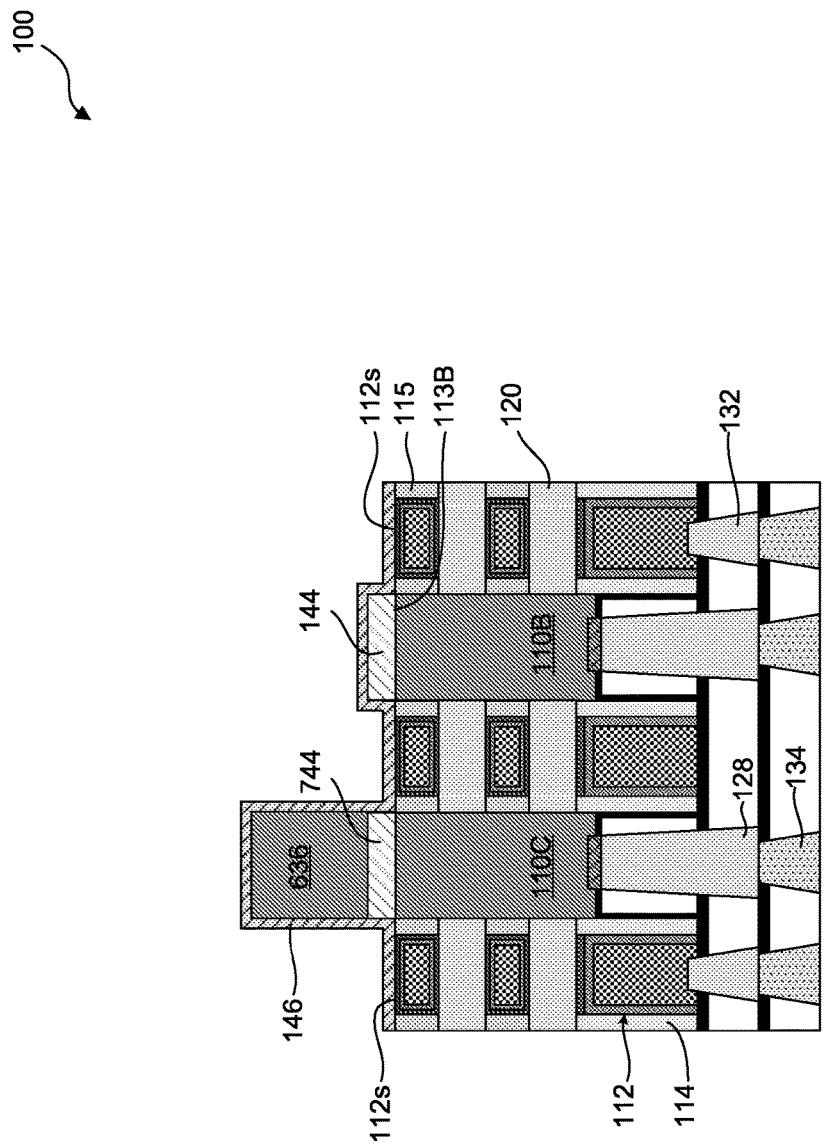
Figure 17:
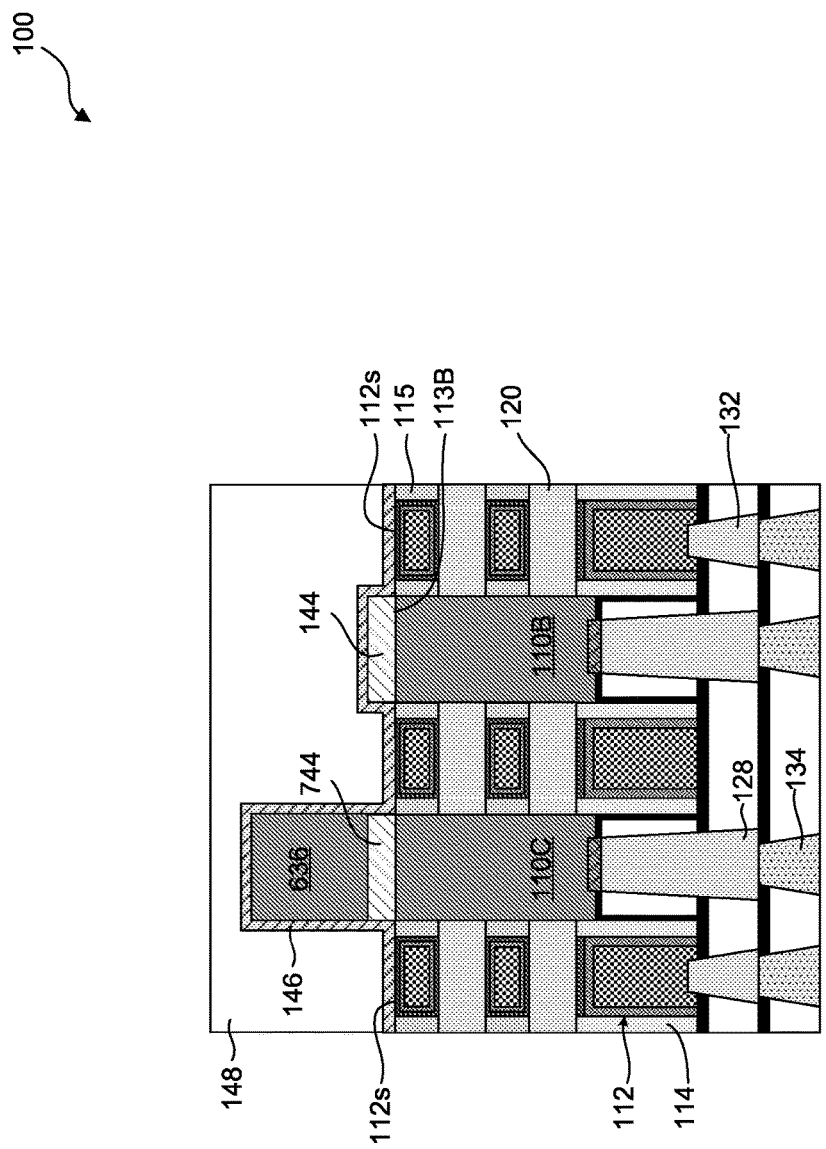
Figure 18:
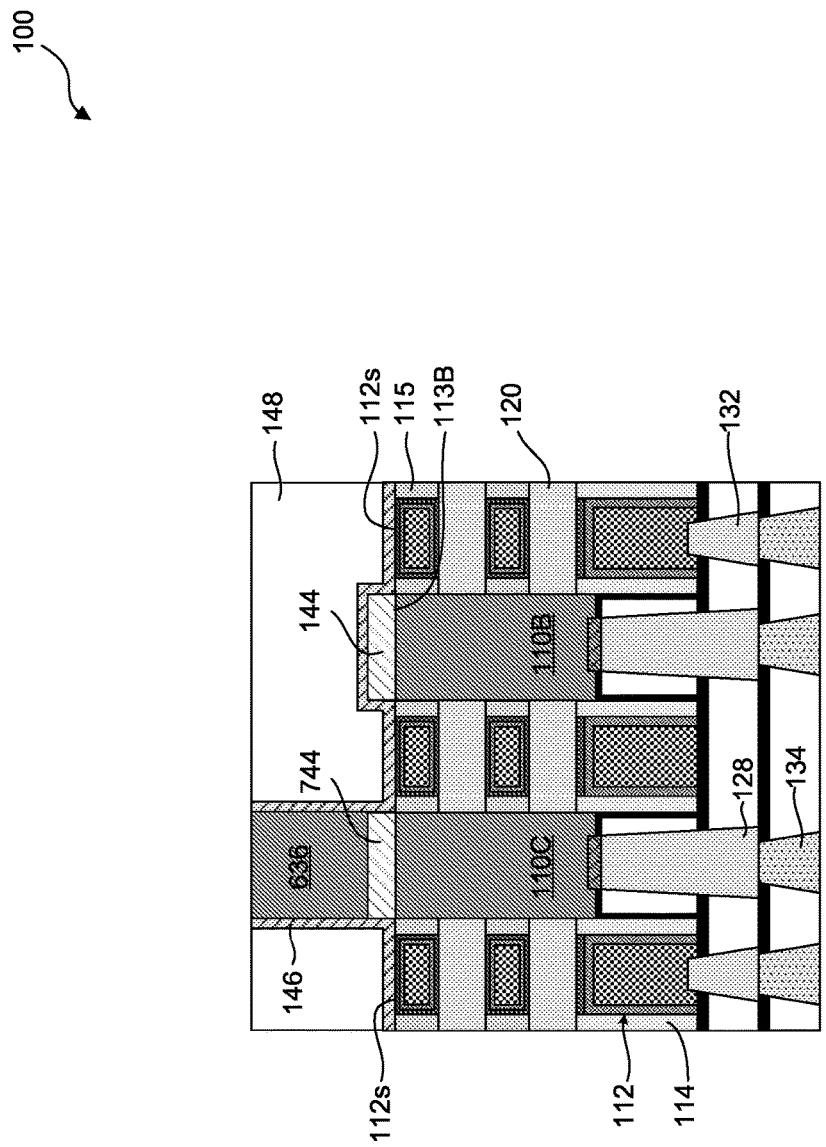

Referring to FIG. 2, in operation 240, front S/D contact structures, gate contact structures, and front vias are formed. For example, as shown in FIG. 13, front S/D contact structures 128, gate contact structures 132, and front vias 134 are formed. Additional elements, such as front metal lines and front vias (not shown for simplicity), can be formed on front vias 134.

Figure 19:
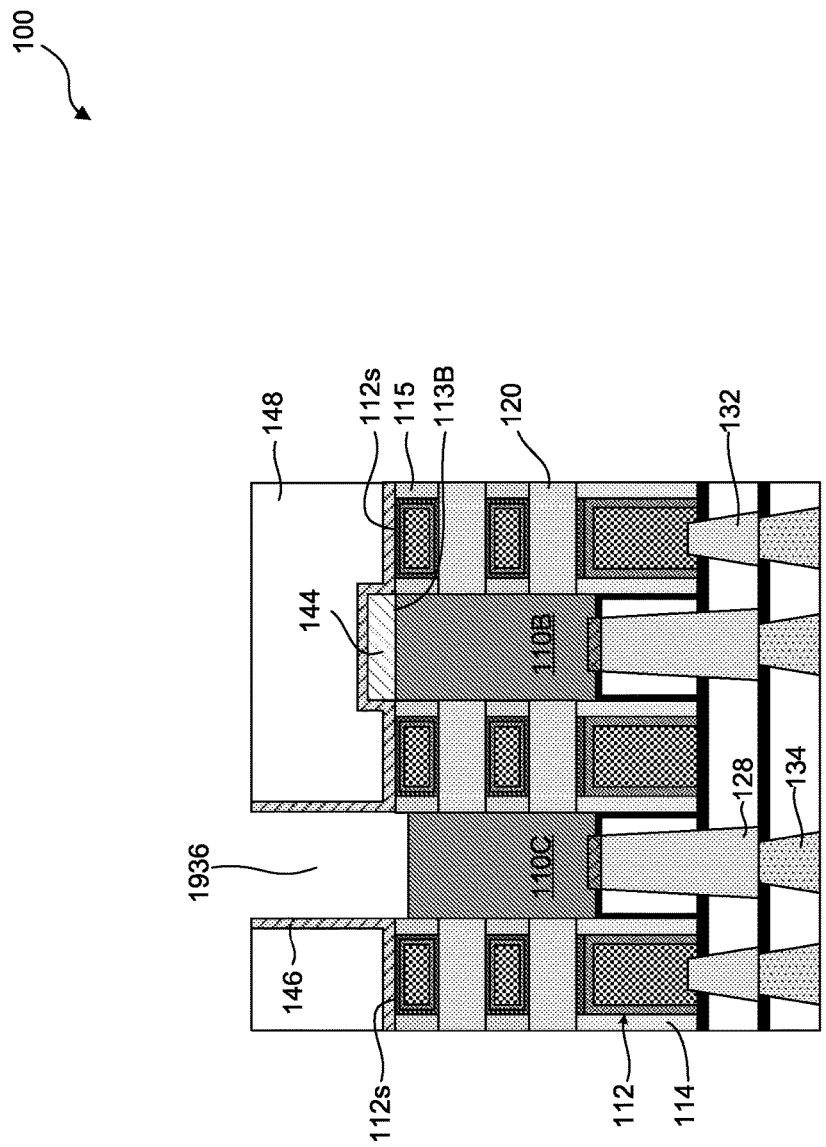
Figure 20:
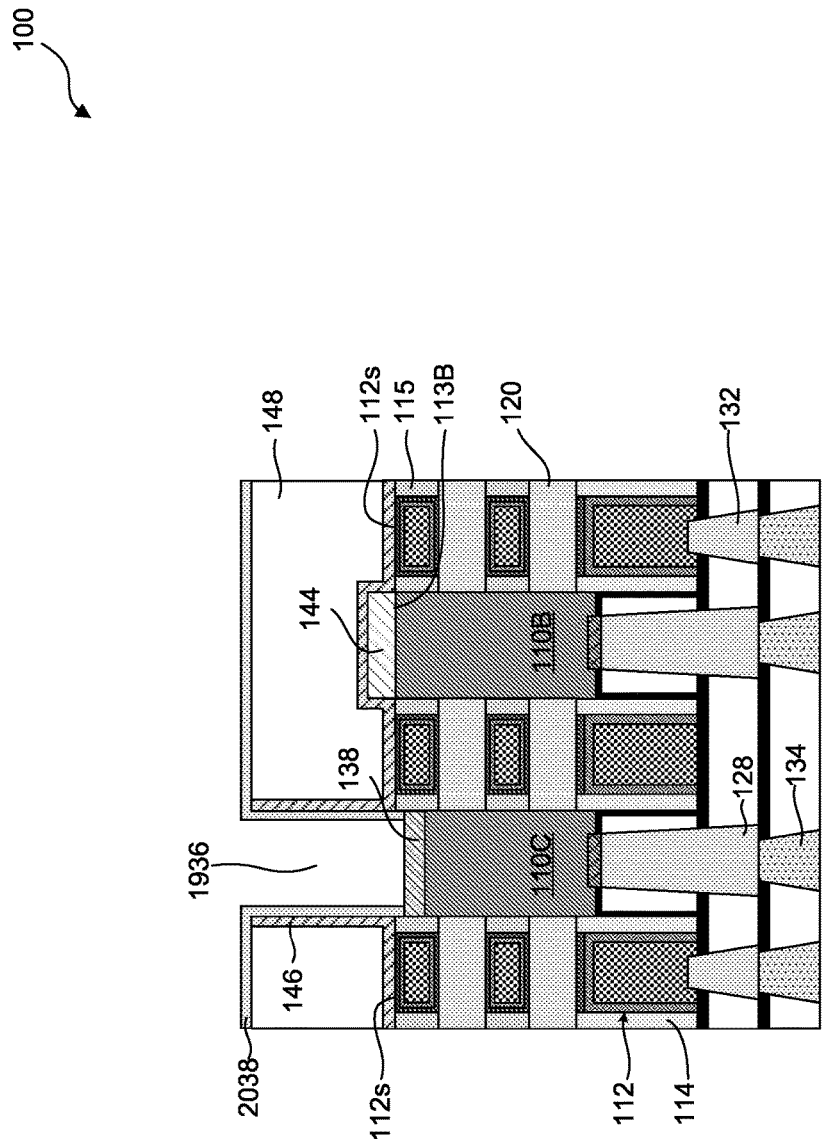
Figure 21:
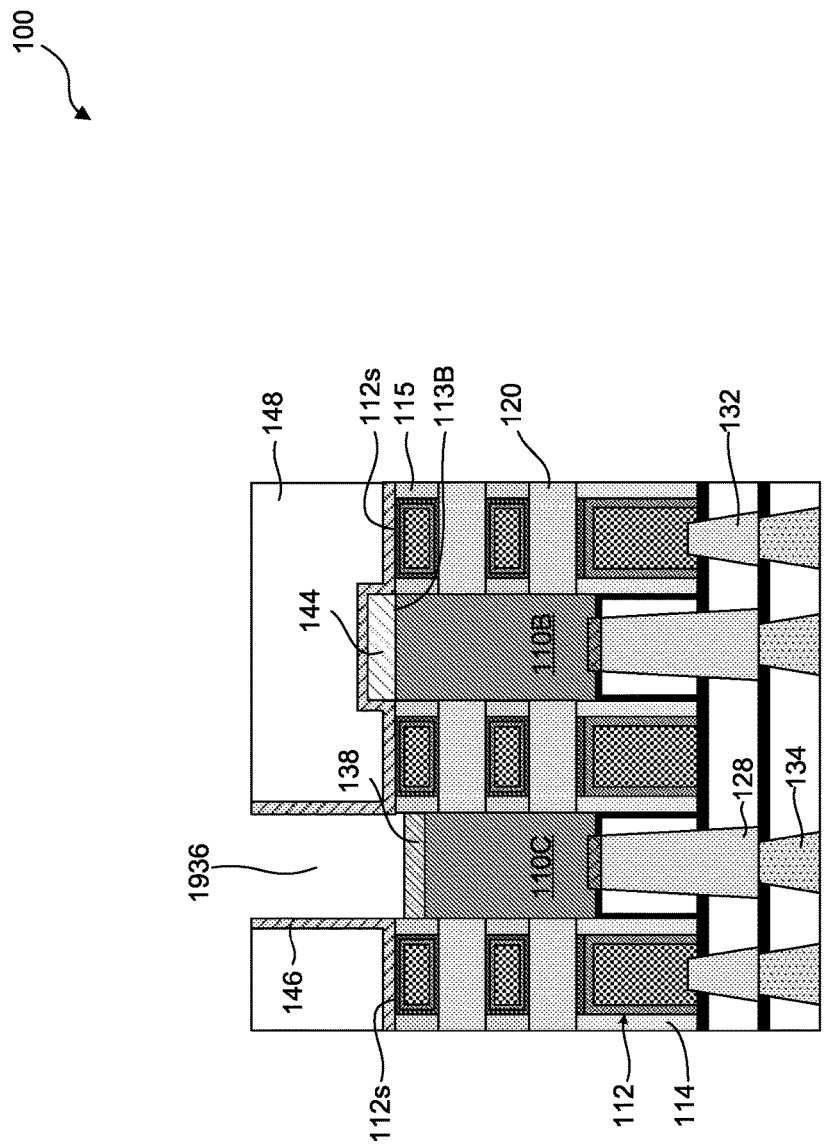
Figure 22:
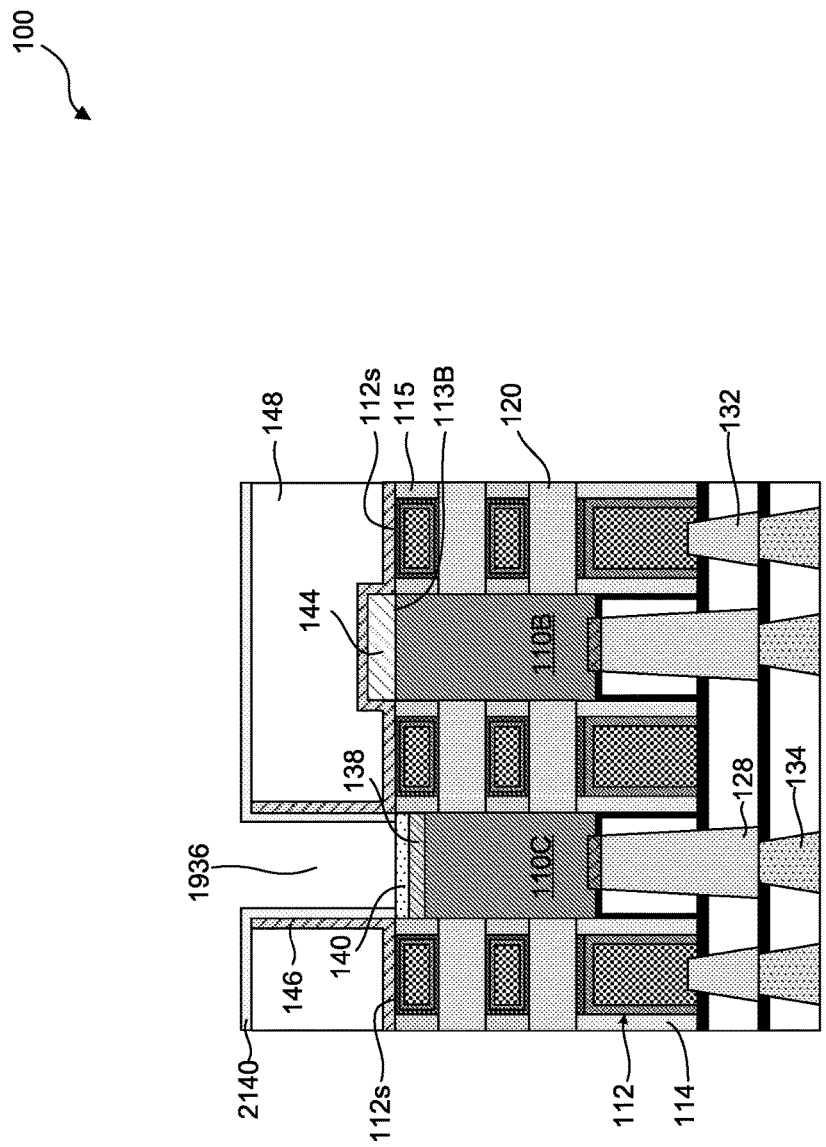
Figure 23:
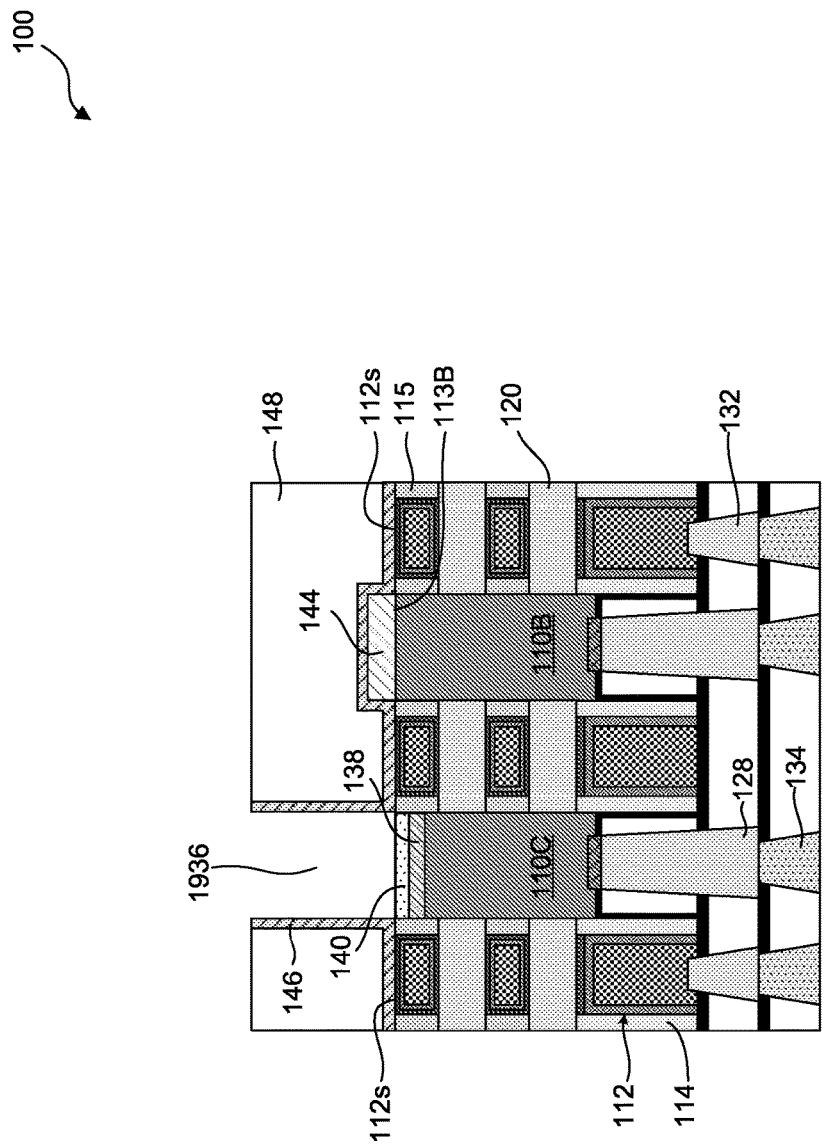
Figure 24:
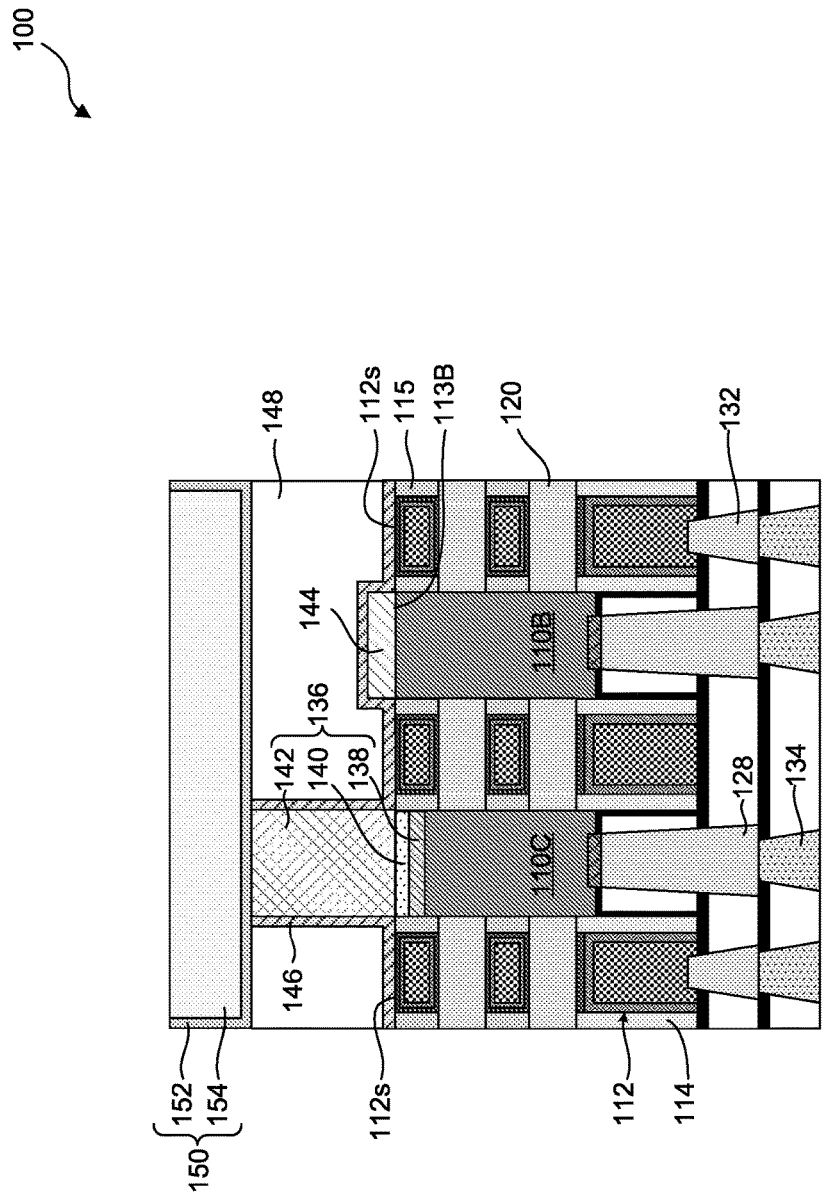

Referring to FIG. 2, in operation 245, the sacrificial epitaxial layer is replaced with a back S/D contact structure. For example, as described with reference to FIGS. 14-22, sacrificial epitaxial layer 636 is replaced with back S/D contact structure 136. The replacement of sacrificial epitaxial layer 636 with back S/D contact structure 136 can include sequential operations of (i) thinning down substrate 104 (shown in FIG. 13) to form the structure of FIG. 14, (ii) etching fin structure 106 (shown in FIG. 14) by a dry etch process to form the structure of FIG. 15, (iii) depositing back barrier layer 146 on the structure of FIG. 15 to form the structure of FIG. 16, (iv) depositing back ILD layer 148 on the structure of FIG. 16 to form the structure of FIG. 17, (v) performing a CMP process on back ILD layer 148 and back ESL 146 to form the structure of FIG. 18, (vi) forming a back contact opening 1936 by etching sacrificial epitaxial layer 636 and back ESL 744, as shown in FIG. 19, (vii) performing a cleaning process (e.g., fluorine-based dry etching process) on the structure of FIG. 19 to remove native oxides from the exposed surface of S/D region 110C within back contact opening 1936, (viii) depositing a WFM layer 2038 on the structure of FIG. 19 to initiate a silicidation reaction between S/D region 110C and the bottom portion (not shown) of WFM layer 2038 to form silicide layer 138, as shown in FIG. 20, (ix) removing, by a dry etch process, the unreacted portions of WFM layer 2038 from the top surface of back ILD layer 148 and from the sidewalls of back contact opening 1936 to form the structure of FIG. 21, (x) depositing a nitride layer 2140 on the structure of FIG. 21 to initiate a reaction between silicide layer 2038 and the bottom portion of nitride layer 2140 to form silicide nitride layer 140, as shown in FIG. 22, (xi) removing, by a dry etch process, the unreacted portions of nitride layer 2140 from the top surface of back ILD layer 148 and from the sidewalls of back contact opening 1936 to form the structure of FIG. 23, (xii) depositing, by a bottom-up deposition process, a conductive layer (not shown) on the structure of FIG. 23 to fill back contact opening 1936, and (xiii) performing a CMP process on the conductive layer to form back via 142, as shown in FIG. 24.

In some embodiments, after or during the cleaning process, the exposed surface of S/D region 110C (shown in FIG. 19) can be etched to form a curved profile or a faceted profile similar to that of silicide layer 138 shown in respective FIG. 1C or FIG. 1D. In some embodiments, the cleaning process can include using a gas mixture of ammonia ($NH_3$) and $NF_3$. In some embodiments, WFM layer 2038 can include Ti, which can be formed using a precursor, such as titanium tetrachloride ($TiCl_4$) at a temperature ranging from about 400° C. to about 500° C. In some embodiments, nitride layer 2140 can include TiN, which can be formed using a precursor, such as $TiCl_4$ with $NF_3$ gas and nitrogen plasma at a temperature ranging from about 400° C. to about 500° C. The formation of silicide layer 138 and silicide nitride layer 140 can be an in-situ process to prevent the oxidation of silicide layer 138.

In some embodiments, the bottom-up deposition of the conductive layer can include depositing a conductive material (e.g., Ru) that has a higher deposition selectivity for silicide nitride layer 140 than portions of back barrier layer 146 along the sidewalls of back contact opening 1936, thus resulting in the bottom-up deposition of the conductive material. In some embodiments, the bottom-up deposition process can include using a thermal chemical vapor deposition (CVD) process, an atomic layer deposition (ALD) process, a pulsed mode CVD process, or a plasma enhanced CVD process with a precursor gas of the conductive material, one or more carrier gases (e.g., Ar, CO, or $N_2$), and one or more reaction gases (e.g., $H_2$, $O_2$, or CO). Each of the carrier and reaction gas can be supplied with a flow rate of about 10 sccm to about 500 sccm (e.g., 10 sccm, about 100 sccm, about 200 sccm, or about 500 sccm).

The bottom-up deposition process can further include depositing the conductive layer at a temperature ranging from about 450° C. to about 500° C. and at a power of about 0.1 mTorr to about 5 Torr. In some embodiments, the precursor gas can include Ruthenium, tricarbonyl[(1,2,4,5-.eta.)-1-methyl-1,4-cyclohexadiene] ($C_{10}H_{10}O_3Ru$), (η6-benzene)((η6-benzene)(η4-1,3-cyclohexadiene) ruthenium (Ru(C6H6)(C6H8)), Ruthenium(III) acetylacetonate 1,3-cyclohexadiene ($Ru(C_5H_7O_2)_3$), (tricarbonyl) ruthenium(0) ($Ru(CO)_3(C_6H_8)$), Bis(ethylcyclopentadienyl) Ruthenium (II) ($Ru(C_5H_4C_2H_5)_2$); Ruthenium pentacarbonyl ($Ru(CO)_5$), or Triruthenium dodecacarbonyl ($Ru_3(CO)_{12}$).

Referring to FIG. 2, in operation 250, a back metal line is formed on the back S/D contact structure. For example, as shown in FIG. 24, back metal line 150 is formed on back S/D contact structure 136.

Figure 25:
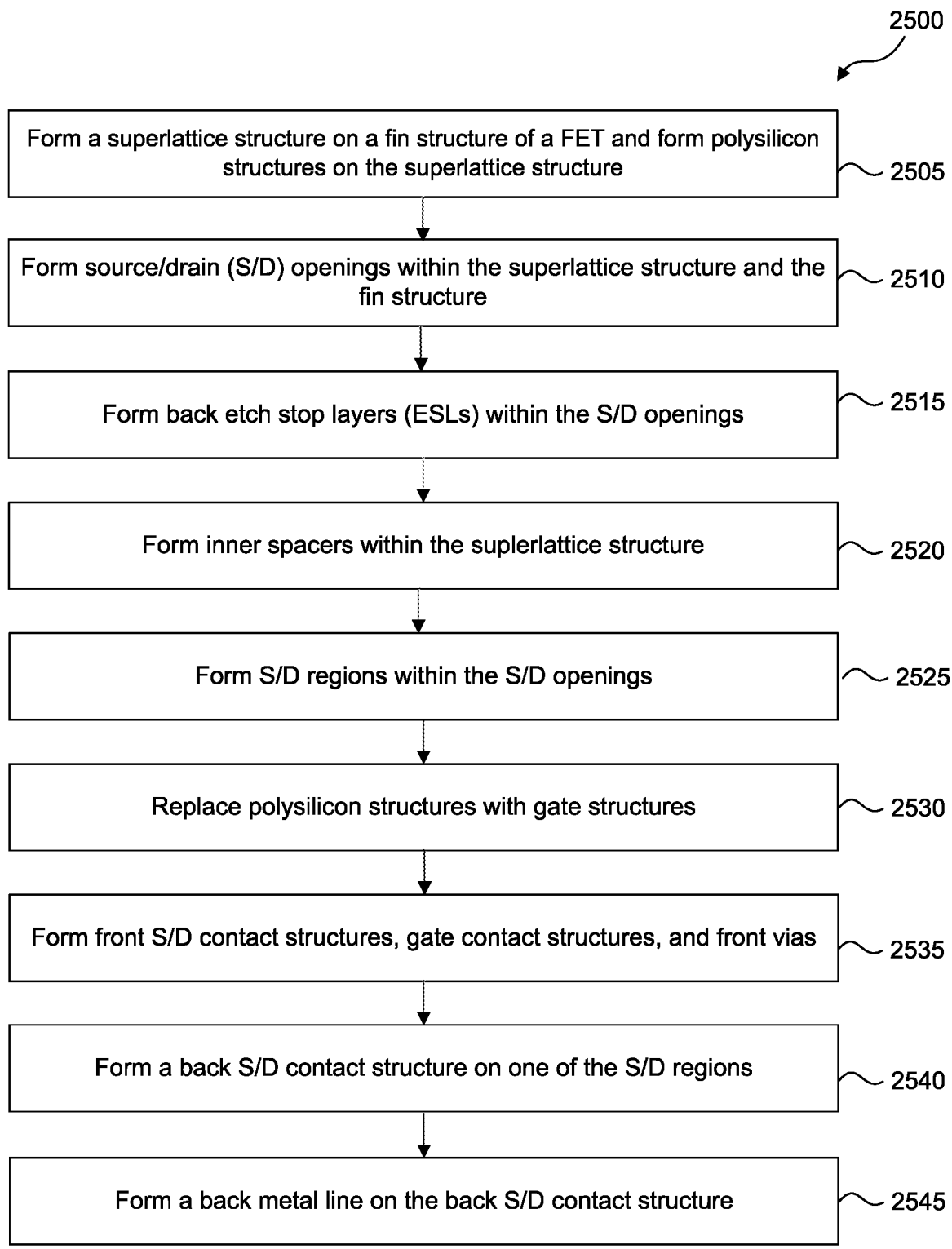
FIG. 25 is a flow diagram of a method for fabricating a semiconductor device with dual side contact structures, in accordance with some embodiments.
Figure 26:
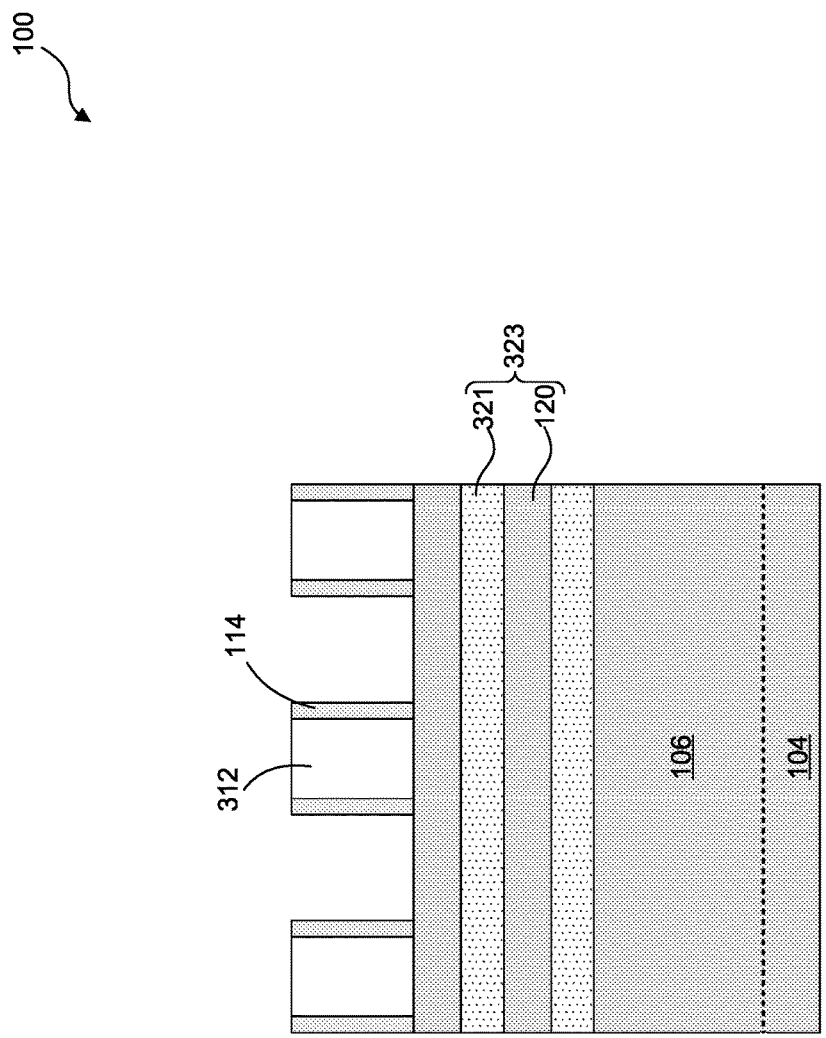
FIGS. 26-35 illustrate cross-sectional views of a semiconductor device with dual side contact structures at various stages of its fabrication process, in accordance with some embodiments.

FIG. 25 is a flow diagram of an example method 2500 for fabricating FET 100 with the cross-sectional view of FIG. 1F, according to some embodiments. For illustrative purposes, the operations illustrated in FIG. 25 will be described with reference to the example fabrication process for fabricating FET 100 as illustrated in FIGS. 26-35. FIGS. 26-35 are cross-sectional views of FET 100 along line A-A of FIG. 1A at various stages of fabrication, according to some embodiments. Operations can be performed in a different order or not performed depending on specific applications. It should be noted that method 2500 may not produce a complete FET 100. Accordingly, it is understood that additional processes can be provided before, during, and after method 2500, and that some other processes may only be briefly described herein. Elements in FIGS. 26-35 with the same annotations as elements in FIGS. 1A-1F are described above.

Referring to FIG. 25, operation 2505 is similar to operation 205 of FIG. 2. The structure of FIG. 26, formed after operation 2505, is similar to the structure of FIG. 3, which is formed after operation 205.

Figure 27:
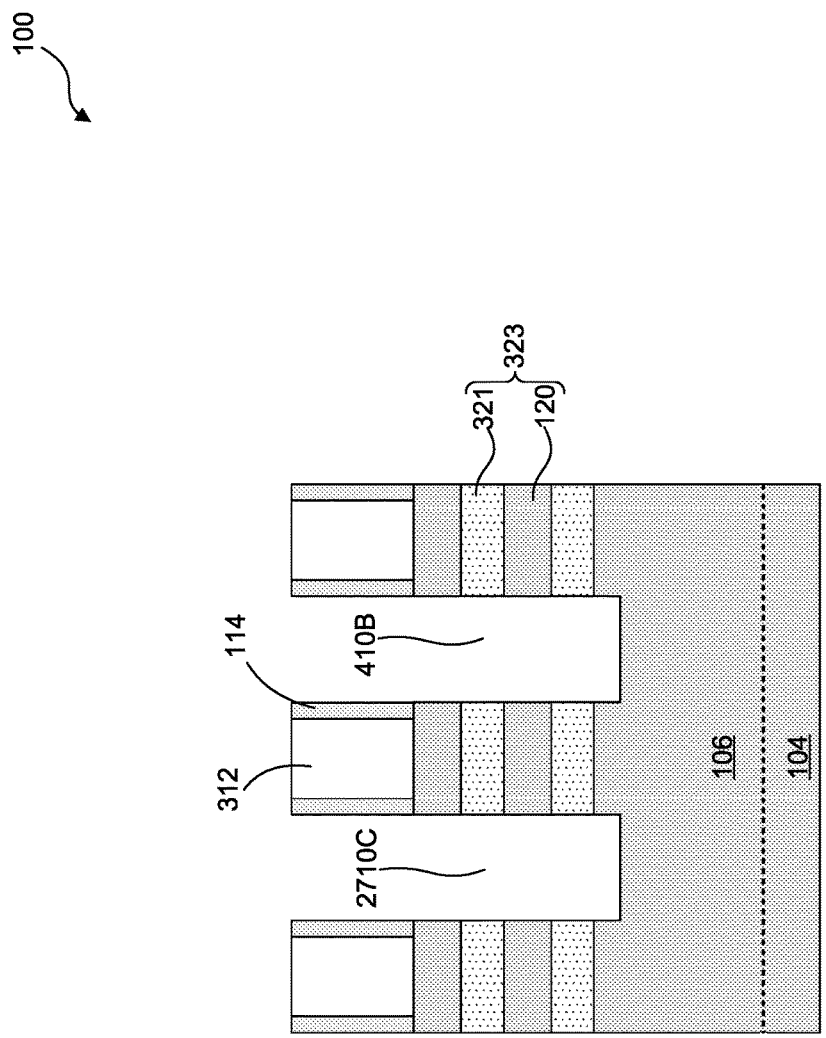

Referring to FIG. 25, in operation 2510, S/D openings are formed within the superlattice structure. For examples, as shown in FIG. 27, S/D openings 410B and 2710C are formed within superlattice structure 323. During subsequent processing, S/D regions 110B and 110C can be formed within respective S/D openings 410B and 2710C. S/D openings 410B and 2710C can have substantially equal heights along a Z-axis.

Figure 28:
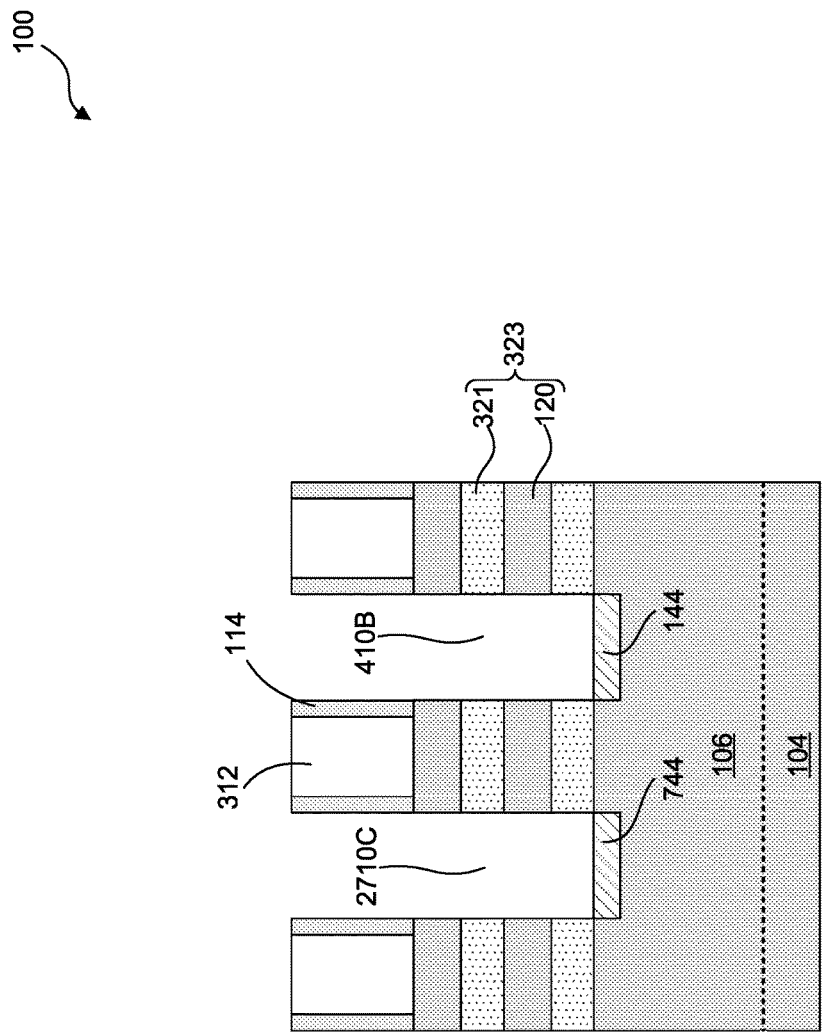
Figure 29:
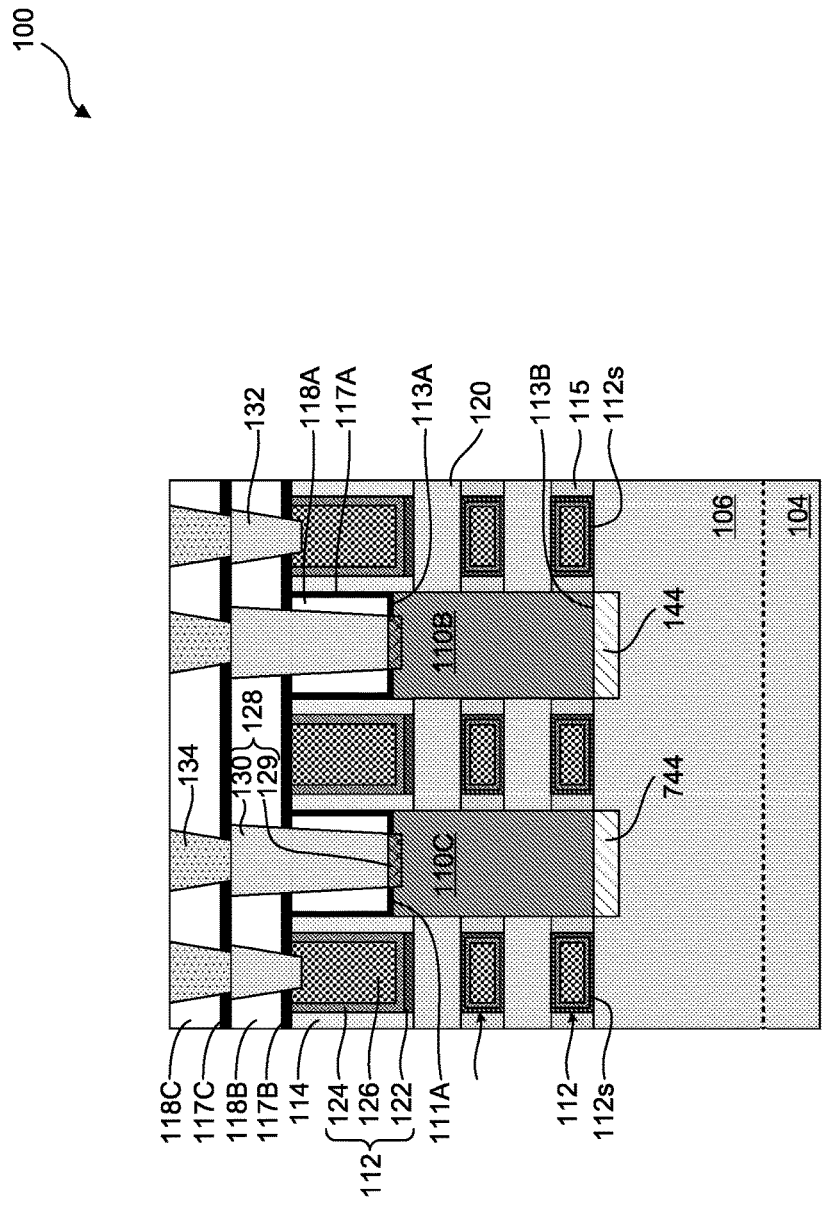
Figure 30:
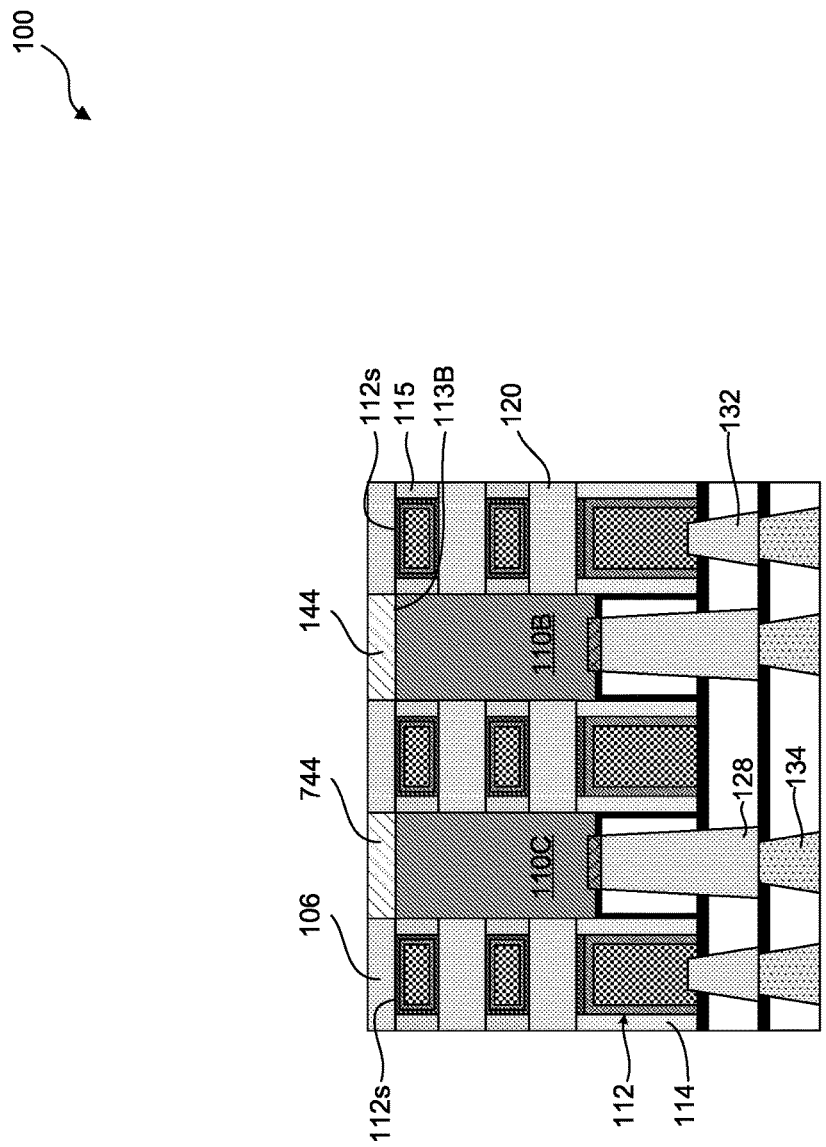
Figure 31:
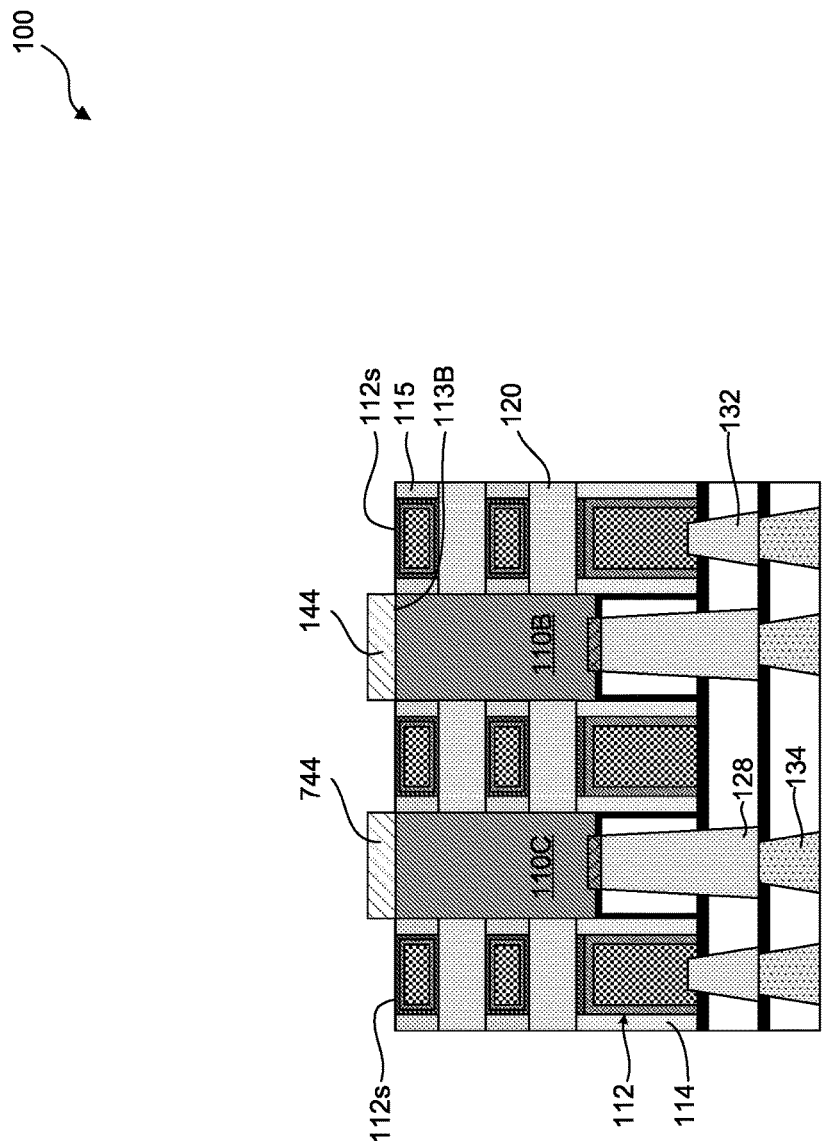

Referring to FIG. 25, in operation 2515, back ESLs are formed within the S/D openings. For example, as shown in FIG. 28, back ESLs 144 and 744 are formed within respective S/D openings 410B and 2710C. In some embodiments, back ESLs 144 and 744 can be formed at the same time by epitaxially growing boron-doped SiGe on the exposed portion of fin structure 106 within S/D openings 410B and 2710C.

Referring to FIG. 25, operations 2520-2535 are similar to respective operations 225-240 of FIG. 2. Operations 2520-2535 are sequentially performed on the structure of FIG. 28 to form the structure of FIG. 29.

Figure 32:
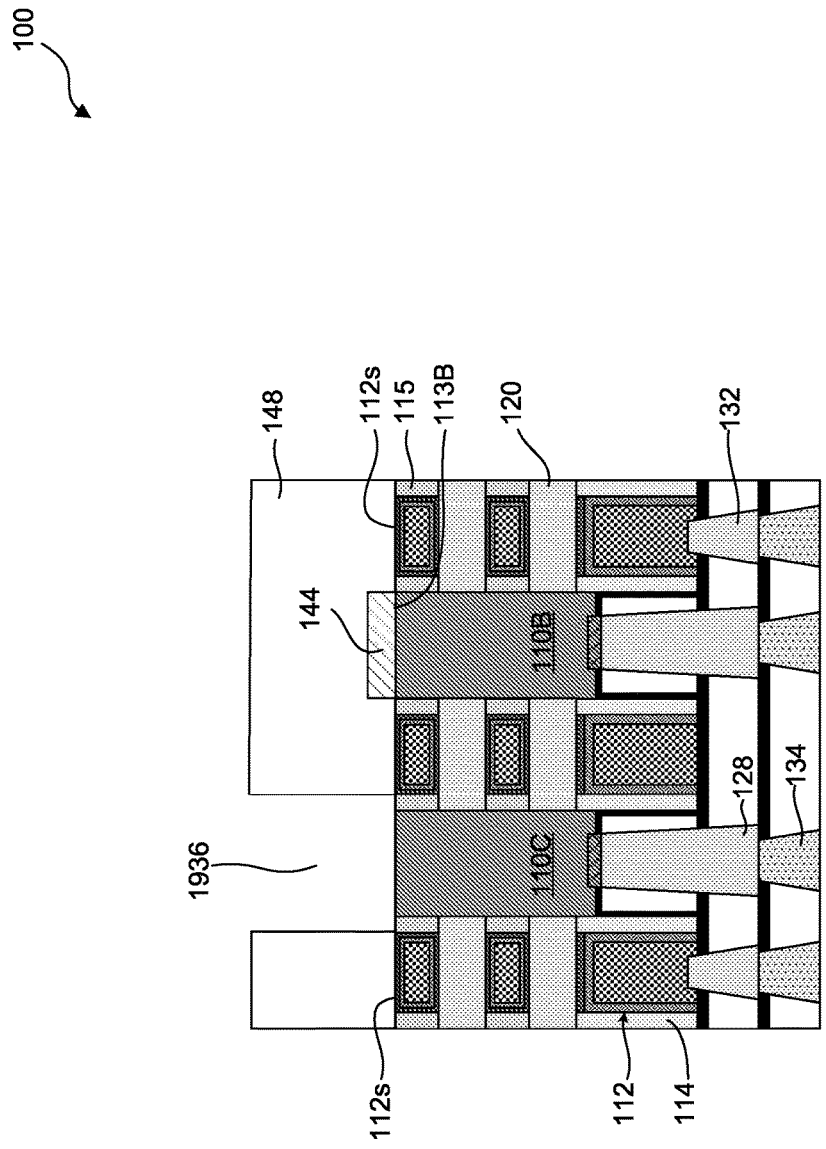
Figure 33:
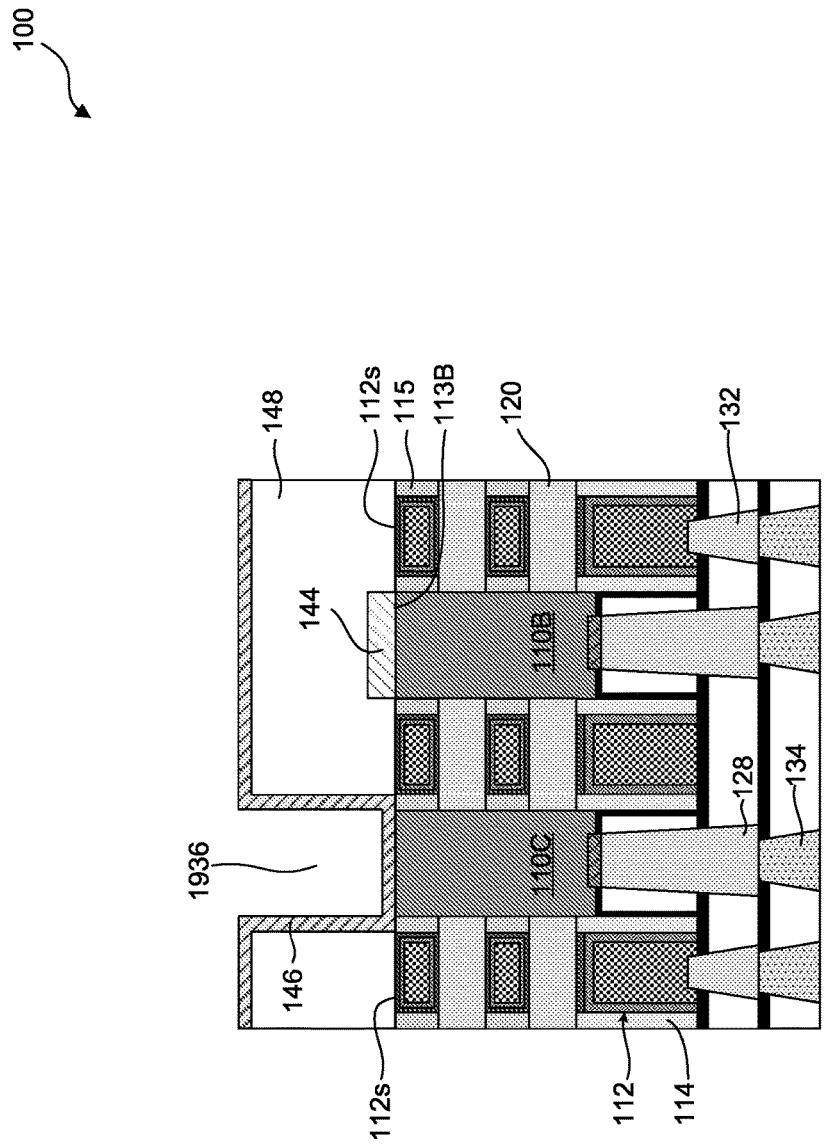
Figure 34:
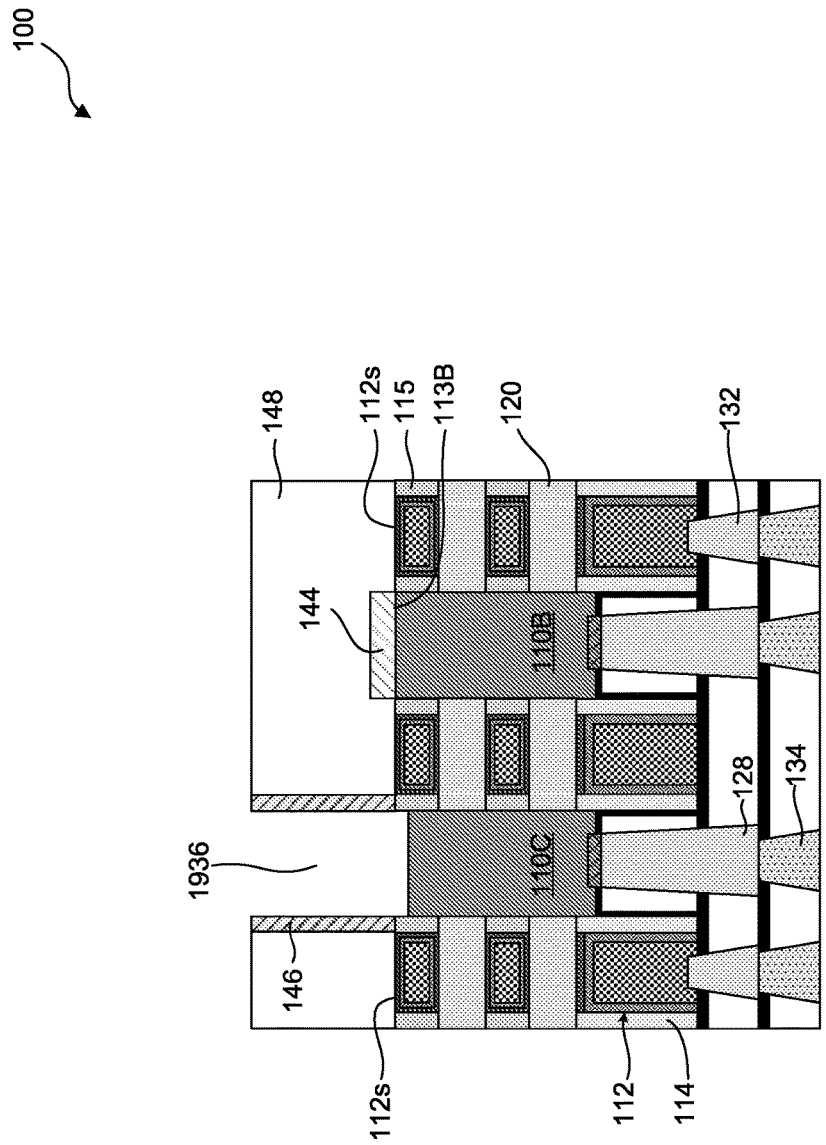
Figure 35:
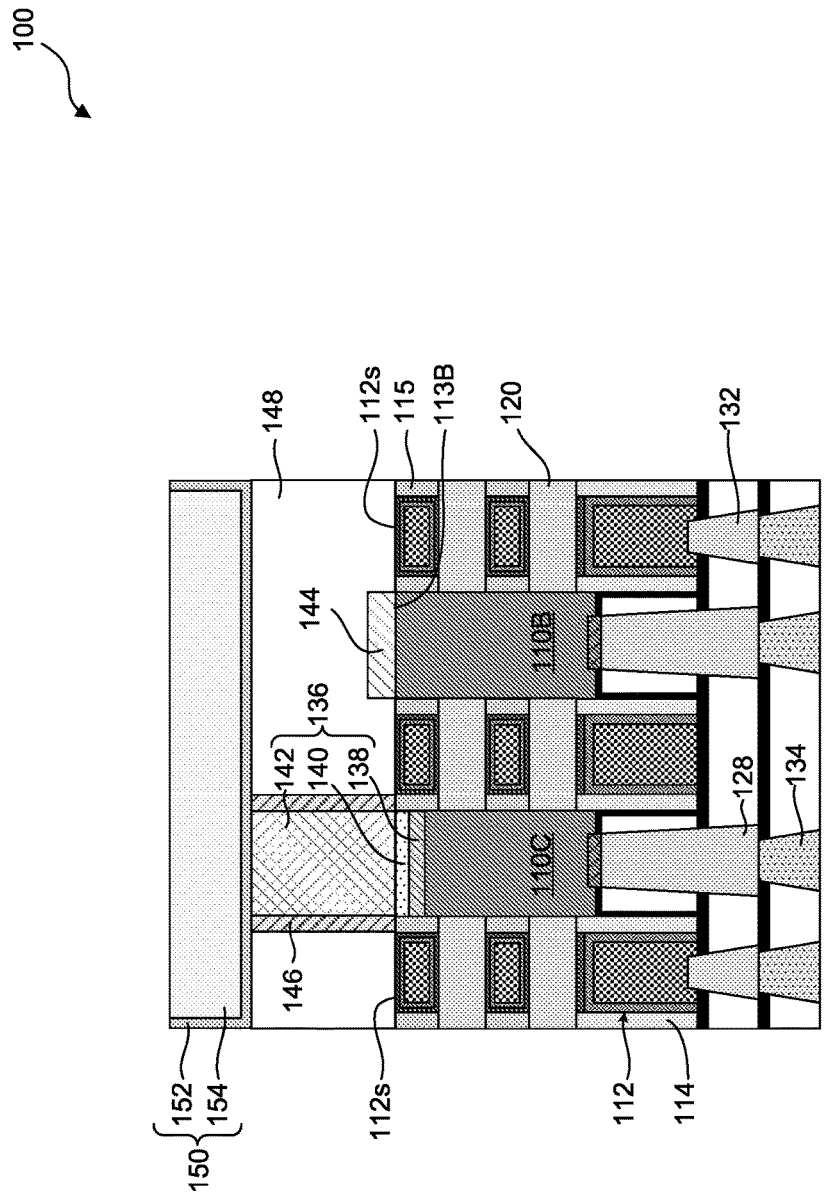

Referring to FIG. 25, in operation 2540, a back S/D contact structure is formed on one of the S/D regions. For example, as described with reference to FIGS. 30-35, back S/D contact structure 136 is formed on S/D region 110C. The formation of back S/D contact structure 136 can include sequential operations of (i) thinning down substrate 104 and fin structure 106 (shown in FIG. 29) to form the structure of FIG. 30, (ii) etching fin structure 106 (shown in FIG. 30) by a dry etch process to form the structure of FIG. 31, (iii) depositing back ILD layer 148 on the structure of FIG. 31, (iv) forming back contact opening 1936 within ILD layer 148, as shown in FIG. 32, (v) etching back ESL 744 through back contact opening 1936 to form the structure of FIG. 32, (vi) depositing back barrier layer 146 on the structure of FIG. 32 to form the structure of FIG. 33, (vii) performing a dry etch process on the structure of FIG. 33 to form the structure of FIG. 34, (viii) performing a cleaning process (e.g., fluorine-based dry etching process) on the structure of FIG. 34 to remove native oxides from the exposed surface of S/D region 110C within back contact opening 1936, (ix) forming silicide layer 138, as shown in FIG. 35, (x) forming silicide nitride layer 140, as shown in FIG. 35, and (xi) forming back via 142, as shown in FIG. 35. The processes for forming silicide layer 138, silicide nitride layer 140, and back via 142 are similar to those described in operation 245 with reference to FIGS. 20-24.

Referring to FIG. 25, similar to operation 250, in operation 2545, back metal line 150 is formed on back S/D contact structure, as shown in FIG. 35.

The present disclosure provides example semiconductor devices (e.g., FET 100) with dual side S/D contact structures (e.g., front and back S/D contact structures 128 and 136) and provides example methods (e.g., methods 200 and 2500) of forming such semiconductor devices with reduced contact resistance between S/D regions (e.g., S/D region 110C) and S/D contact structures. The example method forms arrays of epitaxial S/D regions and gate structures (e.g., gate structures 112) on fin structures (e.g., fin structure 106) of FETs. In some embodiments, one or more S/D regions can have S/D contact structures that are formed on opposite sides of the FETs. One of the S/D contact structures (e.g., front S/D contact structure 128) can be formed on a first surface (e.g., first surface 111A). The other S/D contact structure (e.g., back S/D contact structure 136) can be formed on a second side (e.g., second surface 111B). The back S/D contact structures can electrically connect the FETs to a back-side power rail of an integrated circuit (IC).

In some embodiments, the back S/D contact structures can include liner-free back vias (e.g., back via 142) that are formed by a bottom-up deposition process. The back vias can include Ru-based conductive materials to reduce contact resistance between the back S/D contact structures and S/D regions compared to FETs with non-Ru-based back vias. In some embodiments, the Ru-based back vias with diameters or widths less than about 20 nm (e.g., about 15 nm, about 12.5 nm, about 10 nm, about 7.5 nm, about 5 nm, or about 2 nm) can have lower resistivity compared to copper (Cu), tungsten (W), or Co-based back vias with similar dimensions. Thus, with the use of the Ru-based back vias, compact and low-resistive back S/D contact structures can be formed on the back-side of the FETs.

Each of the back S/D contact structures can further include a stack of metal silicide layer (e.g., silicide layer 138) and metal silicide nitride layer (e.g., silicide nitride layer 140) disposed between the back vias and the S/D regions. In some embodiments, the metal silicide layer and metal silicide nitride layer of NFETs and PFETs can have the same metal (e.g., titanium (Ti)) or can have metals different from each other. In some embodiments, the metal silicide layers of NFETs can include n-type work function metal silicide (nWFM) silicide layers (e.g., titanium silicide) that have a work function value closer to a conduction band energy than a valence band energy of the n-type S/D regions. In contrast, the metal silicide layers of the PFETs can include p-type WFM (pWFM) silicide layers (e.g., nickel silicide) that have a work function value closer to a valence band energy than a conduction band energy of the p-type S/D regions.

In some embodiments, a semiconductor device includes first and second source/drain (S/D) regions, a nanostructured channel region disposed between the first and second S/D regions, a gate structure surrounding the nanostructured channel region, first and second contact structures disposed on first surfaces of the first and second S/D regions, a third contact structure disposed on a second surface of the first S/D region, and an etch stop layer disposed on a second surface of the second S/D region. The second surface of the first S/D region is opposite to the first surface of the first S/D region. The second surface of the second S/D region is opposite to the first surface of the second S/D region. The third contact structure includes a metal silicide layer, a silicide nitride layer disposed on the metal silicide layer, and a conductive layer disposed on the silicide nitride layer.

In some embodiments, a semiconductor device includes first and second source/drain (S/D) regions, a gate structure disposed between the first and second S/D regions, a first contact structure disposed on a front surface of the first S/D region, a second contact structure disposed on a back surface of the first S/D region, and an etch stop layer disposed on a back surface of the second S/D region. The second contact structure includes a work function metal (WFM) silicide layer, a WFM silicide nitride layer disposed on the WFM silicide nitride layer, and a via disposed on the WFM silicide nitride layer.

In some embodiments, a method includes forming a fin structure on a substrate, forming a superlattice structure on the fin structure, forming first and second source/drain (S/D) openings within the superlattice structure and the fin structure, selectively forming a sacrificial epitaxial layer within the first S/D opening, forming first and second etch stop layers within the first and second S/D openings, respectively, forming first and second S/D regions on the first and second etch stop layers, respectively, forming a gate structure between the first and second S/D regions, and replacing the sacrificial epitaxial layer with a third contact structure.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a stack of first and second nanostructured layers on a substrate;
   forming first and second openings in the substrate and in the stack of first and second nanostructured layers;
   forming an epitaxial layer on exposed surfaces in the first opening;
   forming first and second etch stop layers (ESLs) in the first and second openings, respectively;
   forming first and second source/drain (S/D) regions on the first and second ESLs, respectively; and
   replacing the epitaxial layer and portions of the substrate under the epitaxial layer with a contact structure on the first S/D region.

2. The method of claim 1, wherein forming the epitaxial layer comprises:
   growing the epitaxial layer to cover sidewalls of the substrate and the first nanostructured layer in the first opening; and
   etching the epitaxial layer to expose the sidewalls of the first nanostructured layer and portions of the sidewalls of the substrate in the first opening.

3. The method of claim 1, wherein forming the epitaxial layer comprises epitaxially growing a silicon germanium layer on the exposed surfaces in the first opening.

4. The method of claim 1, further comprising growing an other epitaxial layer in the second opening.

5. The method of claim 1, further comprising:
   growing an other epitaxial layer in the second opening; and
   etching the other epitaxial layer prior to depositing the second ESL layer in the second opening.

6. The method of claim 1, wherein forming the first and second ESLs comprises forming the first and second ESLs with top surfaces substantially coplanar with a bottom surface of the first nanostructured layer.

7. The method of claim 1, wherein forming the first and second ESLs comprises epitaxially growing a boron-doped silicon germanium layer in the first and second openings, respectively.

8. The method of claim 1, further comprising removing the first ESL prior to forming the contact structure.

9. The method of claim 1, wherein replacing the epitaxial layer with the contact structure comprises:
   etching the substrate to expose a back surface and sidewalls of the epitaxial layer;
   depositing a nitride layer on the back surface and sidewalls of the epitaxial layer; and
   etching the epitaxial layer to expose sidewalls of the nitride layer.

10. The method of claim 1, wherein replacing the epitaxial layer with the contact structure comprises:
    etching the epitaxial layer to expose the first ESL;
    removing the first ESL to expose a back surface of the first S/D region;
    forming a silicide layer on the back surface of the first S/D region; and
    forming a silicide nitride layer on the silicide layer.

11. A method, comprising:
    forming a stack of first and second nanostructured layers on a substrate;
    forming an opening in the substrate and in the stack of first and second nanostructured layers;
    forming a doped semiconductor layer in the opening;
    forming a source/drain (S/D) region on a first surface the doped semiconductor layer;
    removing the substrate to expose a second surface of the doped semiconductor layer;
    removing the doped semiconductor layer to expose a first surface of the S/D region; and
    forming a first contact structure on the first surface of the S/D region.

12. The method of claim 11, wherein forming the doped semiconductor layer comprises epitaxially growing a boron-doped silicon germanium layer.

13. The method of claim 11, further comprising forming a second contact structure on a second surface of the S/D region prior to removing the substrate.

14. The method of claim 11, further comprising forming a gate structure surrounding the first nanostructured layer prior to removing the substrate.

15. The method of claim 11, further comprising forming nitride layers along sidewalls of the first contact structure.

16. The method of claim 11, wherein forming the first contact structure comprises:
    forming a silicide layer on a back surface of the S/D region; and
    forming a silicide nitride layer on the silicide layer.

17. A semiconductor device, comprising:
    a substrate;
    a source/drain (S/D) region disposed on the substrate;
    a first contact structure disposed on a first surface of the S/D region; and
    a second contact structure, disposed on a second surface of the S/D region, comprising:
        a silicide layer,
        a silicide nitride layer disposed on the silicide layer, and
        a conductive layer disposed on the silicide nitride layer.

18. The semiconductor device of claim 17, wherein the silicide layer and the silicide nitride layer comprise a same metal.

19. The semiconductor device of claim 17, further comprising:
    an other S/D region disposed on the substrate;
    a third contact structure disposed on a first surface of the an other S/D region; and
    an etch stop layer disposed on a second surface of the other S/D region, wherein the second surface of the other S/D region is opposite to the first surface of the other S/D region.

20. The semiconductor device of claim 19, wherein the etch stop layer comprises a boron-doped silicon germanium layer.

* * * * *

UNITED STATES PATENT AND TRADEMARK OFFICE
CERTIFICATE OF CORRECTION

PATENT NO. : 12,046,634 B2
APPLICATION NO. : 18/158148
DATED : July 23, 2024
INVENTOR(S) : Chang et al.

It is certified that error appears in the above-identified patent and that said Letters Patent is hereby corrected as shown below:

In the Specification

In Column 4, Line 55, delete "(JO)" and insert -- (IO) --, therefor.

In Column 5, Line 26, delete "SiGe" and insert -- $SiGe_x$ --, therefor.

In Column 5, Line 29, delete "SiGe" and insert -- $SiGe_x$ --, therefor.

In Column 9, Line 55, delete "JO" and insert -- IO --, therefor.

Signed and Sealed this
Fifteenth Day of October, 2024

Katherine Kelly Vidal
*Director of the United States Patent and Trademark Office*